(12) United States Patent
Pastore et al.

(10) Patent No.: US 9,203,424 B1
(45) Date of Patent: Dec. 1, 2015

(54) DIGITAL-TO-ANALOG CONVERTER CIRCUIT FOR USE IN A POWER CONVERTER

(71) Applicant: Power Integrations, Inc., San Jose, CA (US)

(72) Inventors: Tiziano Pastore, Los Gatos, CA (US); Ricardo Luis Janezic Pregitzer, Campbell, CA (US); Mingming Mao, Saratoga, CA (US); Peter Vaughan, Los Gatos, CA (US)

(73) Assignee: Power Integrations, Inc., San Jose, CA (US)

( * ) Notice: Subject to any disclaimer, the term of this patent is extended or adjusted under 35 U.S.C. 154(b) by 56 days.

(21) Appl. No.: 14/276,834

(22) Filed: May 13, 2014

(51) Int. Cl.
| | | |
|---|---|---|
| *H02M 3/335* | (2006.01) | |
| *H03M 1/68* | (2006.01) | |
| *H03M 1/74* | (2006.01) | |
| *H03M 1/66* | (2006.01) | |

(52) U.S. Cl.
CPC ............ *H03M 1/68* (2013.01); *H02M 3/33515* (2013.01); *H03M 1/745* (2013.01)

(58) Field of Classification Search
CPC ......... H03M 1/66; H03M 1/68; H03M 1/745; H03M 1/1747; H02M 3/335; H02M 3/33515; H02M 3/157; H02M 7/529; H02M 2001/0012

USPC .......................... 341/144, 145, 146, 147, 153; 363/21.12, 21.13, 21.17, 21.18, 97
See application file for complete search history.

(56) References Cited

U.S. PATENT DOCUMENTS

| | | | | |
|---|---|---|---|---|
| 6,958,719 B2 * | 10/2005 | Moon | ................... | H03M 1/687 341/135 |
| 7,978,107 B1 * | 7/2011 | Mao | ........................ | H03M 1/66 323/283 |
| 8,094,055 B2 | 1/2012 | Gaknoki | | |
| 8,098,503 B2 | 1/2012 | Gaknoki et al. | | |
| 2012/0092902 A1 * | 4/2012 | Gaknoki | ............... | H02M 7/217 363/21.12 |

* cited by examiner

*Primary Examiner* — Gary L Laxton
(74) *Attorney, Agent, or Firm* — Blakely Sokoloff; Taylor & Zafman LLP

(57) ABSTRACT

A digital-to-analog converter circuit includes an input to receive a digital input signal having multiple bits. A modulation circuit is coupled to respond to less significant bits of the digital input signal by outputting a modulation signal that alternates between a logic low level and a logic high level. A digital-to-analog circuit is configured to convert more significant bits of the digital input signal to a first analog level. The digital-to-analog circuit is configured to alternate an analog output between the first analog level corresponding to a value of the more significant bits and a second analog level corresponding to one of adjacent values of the more significant bits in response to the modulation signal.

21 Claims, 16 Drawing Sheets

DIGITAL-TO-ANALOG CONVERTER CIRCUIT FOR USE IN A POWER CONVERTER

REFERENCE TO RELATED APPLICATION

This application is related to U.S. patent application Ser. No. 14/276,812 of Pastore et al., filed May 13, 2014, entitled "MULTI-PACE CONTROLLER," and assigned to the Assignee of the present application.

BACKGROUND INFORMATION

1. Field of the Disclosure

The present invention relates generally to power supplies, and more specifically, the invention relates to switch mode power supplies.

2. Background

Many electronic devices, such as cell phones, laptops, etc., are powered by a source of direct current (dc) power. Conventional wall outlets generally deliver a high voltage alternating current (ac) power that needs to be transformed to dc power in order to be used as a power source by most consumer electronic devices. Switch mode power converters, also referred to as switch mode power supplies, are commonly used due to their high efficiency, small size, and low weight to convert the high voltage ac power to a regulated dc power. In one example, switch mode power converters are used to provide regulated power to light emitting diode (LED) devices.

One important consideration for a switch mode power converter is the shape and the phase of the input current drawn from the power source relative to the ac input voltage. The shape of the ac input voltage is typically sinusoidal but because a switching power converter presents itself as a non-linear load, the shape of the input current drawn from the power source may become distorted (non-sinusoidal) and/or out of phase with ac input voltage. This results in increased power loss in the power distribution systems.

Correction of the input current waveform to reduce shape and/or phase mismatch with respect to input voltage is referred to as power factor correction (PFC). The power factor may be defined as the ratio of the average power over a cycle to the product of the root mean square (rms) voltage and the rms current. That is, the power factor may represent the ratio of the amount of usable power to the amount of total power delivered to the load. As such, the power factor may have a value between zero and one, with unity power factor being the optimal. If the input current is sinusoidal and perfectly in-phase with the input voltage, the power factor of the power supply is one, and none of the energy delivered to the load is returned to the power source. However, as the switch mode power supply distorts the wave shape of the input current and/or introduces a phase shift with respect to the input voltage, the power factor decreases. Several regulatory agencies have set tight standards that typically stipulate for greater power factors and/or lower harmonic content of the input current.

One example application where switch mode power supplies may be required to perform PFC is power conversion systems that are used in light emitting diode (LED) lighting. Since the brightness of light provided by LED lamps is a function of the current through LEDs, the power supply used in such a system may also regulate the current provided to LEDs at the output of the power supply. In other words, the power supply may provide both output current regulation and PFC.

Output current regulation is typically achieved by a power supply controller by sensing the current provided to the LEDs. A feedback signal is used to represent a current through the LEDs. The power supply controller controls the transfer of energy from an input to an output of the power supply in response to the feedback signal. Switch mode power supplies typically respond very quickly to fluctuations in the feedback signal by adjusting the energy transfer to regulate the LED current at a desired level. However, making rapid changes to the energy transfer can compromise the PFC performance and cause the input current to be non-sinusoidal and/or out of phase with the input voltage, resulting in a reduced power factor.

A switch mode power supply may use a controller to control the switching (i.e., the turning on and turning off) of a power switch to provide a desired output to a load. The controller may regulate the output at a desired level in response to a feedback signal representative of the output of the power supply. Some controllers may use a digital control signal to adjust the operating condition (e.g., on-time, switching frequency) of the power switch in response to the feedback signal. Such a controller may employ a digital-to-analog converter (DAC) to convert the binary values of the control signal to corresponding discrete levels of an analog signal that may be used to set the operating condition of the power switch. For some types of DACs, such as binary-weighted DACs, as the number of the bits of the control signal is increased, the number of different operating conditions to which the power switch can be set is increased. As a result, the area on the silicon occupied by the DAC components such as current sources, resistors, etc., may grow and make such an implementation impractical.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
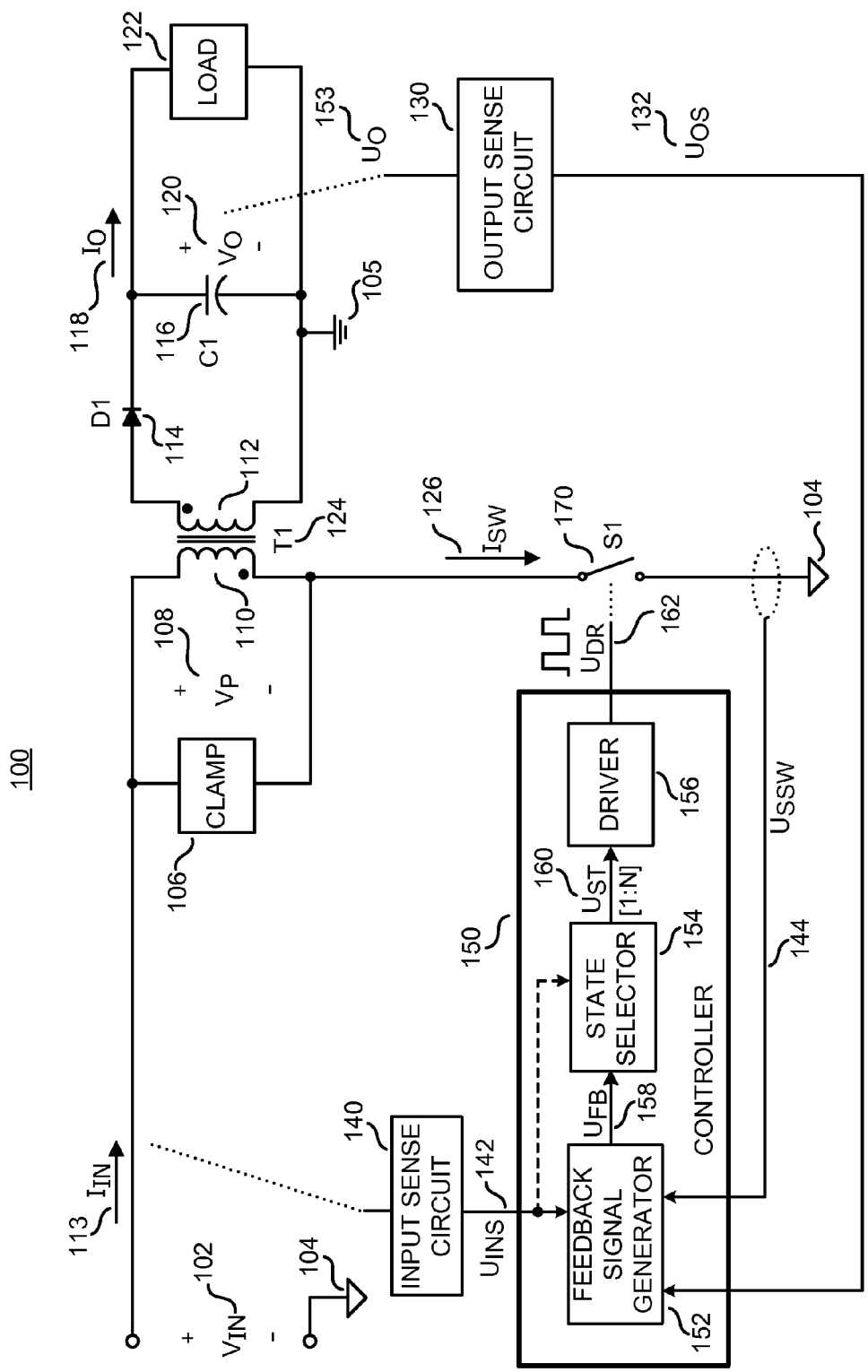
FIG. 1A shows a schematic diagram illustrating an example switch mode power converter including a controller with a state selector circuit and a driver circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, an example power converter in accordance with the teachings of the present invention includes a controller with a state selector circuit that generates multiple count signals in response to comparisons of a feedback signal of the power converter with different threshold signals. In one example, the state selector circuit generates two count signals, first count signal and second count signal, and outputs a state signal in response to these count signals. In the example, the state selector circuit may be coupled to change the state signal at a different rate depending on the values of first and second count signals. In addition, the controller of the example power converter includes a driver circuit that is coupled to generate a drive signal in response to the state signal to drive the switching of a power switch to control a transfer of energy from an input of the power converter to an output of the power converter in accordance with the teachings of the present invention.

To illustrate, FIG. 1A shows an example switch mode power converter 100, also referred to as a switch mode power supply, with a controller 150 that includes a state selector circuit 154 and a driver circuit 156 in accordance with the teachings of the present invention. In the illustrated example, power supply 100 receives an input current $I_{IN}$ 113 and an input voltage $V_{IN}$ 102 to output a dc output voltage $V_O$ 120 and a dc output current $I_O$ 118 to a load 122. Input voltage $V_{IN}$ 102 may be representative of an ac line voltage. Load 122 may include one or more LEDs. In one example, input voltage $V_{IN}$ 102 is a rectified and filtered ac voltage. As shown, input voltage $V_{IN}$ 102 is referenced to a ground terminal 104, which may also be referred to as an input return terminal. Output voltage $V_O$ 120 is referenced to a ground terminal 105, which may also be referred to as an output return terminal. In the example, input return terminal 104 represents the lowest potential or the lowest voltage against that all voltages on the input side of power supply 100 are measured or defined, and output return terminal 105 represents the lowest potential or the lowest voltage against that all voltages on the output side of power supply 100 are measured or defined. In some cases, input return terminal 104 and output return terminal 105 may correspond to the same voltage or potential. In some other cases, input return terminal 104 and output return terminal 105 may correspond to the different voltages or potentials.

As shown in the depicted example, power supply 100 may further include an energy transfer element T1 124, a power switch S1 170, a diode D1 114 and a capacitor C1 116. In the illustrated example, energy transfer element T1 124 is a coupled inductor, which is sometimes referred to as a transformer, with a primary winding 110 and a secondary winding 112. In one example, primary winding 110 has one end coupled to the input voltage $V_{IN}$ 102 and the opposite end coupled to power switch S1 170. Secondary winding 112 has one end coupled to return terminal 104 and the opposite end coupled to diode D1 114. Diode D1 114 is further coupled to capacitor C1 116, which is coupled between the output of power supply 100 and return terminal 104. While the polarities of primary winding 110 and secondary winding 112, which are indicated by the dots at one end of each winding (dotted ends have the same polarity), show that power supply 100 is configured as a flyback power supply, it should be appreciated that other power supply topologies may also be used in accordance with the teachings of the present invention. In the depicted example, power switch S1 170 represents the operation of a controlled semiconductor device such as for example a metal oxide semiconductor field effect transistor (MOSFET) or for example a bipolar junction transistor (BJT). As shown, power switch S1 170 is coupled to energy transfer element T1 124 at primary winding 110 and to the input of power supply 100 at return terminal 104.

In one example, controller 150 may be coupled to control the switching of power switch S1 170 to control the energy transfer from the input to the output of power supply 100, thereby regulating an output quantity $U_O$ 153 (e.g., output voltage $V_O$ 120, output current $I_O$ 118, or the combination of the two) at a desired level. In addition, controller 150 may control the switching of power switch S1 170 to provide input current $T_{IN}$ 113 that is in phase with and proportional to input voltage $V_{IN}$ 102. That is, controller 150 may control the switching of power switch S1 170 to provide PFC. In the illustrated example, controller 150 may provide a drive signal $U_{DR}$ 162 to power switch S1 170 to control the switching (i.e., the turning ON and turning OFF) of power switch S1 170. For example, in response to drive signal $U_{DR}$ 162, power switch S1 170 may be switched to a closed position, which is also referred to as being turned ON or being in an ON state, and in turn, may conduct current that is represented by a switch current $I_{SW}$ 126. Similarly, in response to drive signal $U_{DR}$ 162, power switch S1 170 may be switched to an open position, which is also referred to as being turned OFF or being in an OFF state, in which power switch S1 170 may substantially prevent current conduction.

During the operation of power supply 100, when power switch S1 170 is in the ON state, the voltage across primary winding 110 of energy transfer element T1 124 becomes substantially equal to input voltage $V_{IN}$ 102 and causes current in primary winding 110 to increase linearly, which results in energy to be stored in energy transfer element T1 124. When power switch S1 170 is in the OFF state, the energy stored in energy transfer element T1 124 while power switch S1 170 was conducting begins to transfer to output capacitor C1 116 and load 122. This energy transfer may produce a pulsating current in diode D1 114, which may be filtered by output capacitor C1 116 to produce a substantially constant output voltage $V_{OUT}$ 120. In one example, the switching of power switch S1 170 may produce a substantially constant output current $I_O$ 118 to be provided to load 122.

As shown in the example, a clamp circuit 106 is coupled across primary winding 110 of energy transfer element T1 124 and is coupled to the input of power supply 100. In the example, clamp circuit 106 operates to clamp turn-off spikes that result from leakage inductance from primary winding 110 across the switching device S1 170.

As further depicted in the example shown in FIG. 1A, controller 150 may be coupled to sense switch current $I_{SW}$ 126 as a sensed switch signal $U_{SSW}$ 144. Any known technique to sense current, such as for example receiving the voltage across a resistor conducting the current, or for example receiving a scaled current from a current transformer, or for example receiving the voltage across the on-resistance of a MOSFET that conducts the current, may be used to sense switch current $I_{SW}$ 126 and to provide sensed switch signal $U_{SSW}$ 144 to controller 150 in accordance with the teachings of the present invention.

In one example, controller 150 may be further coupled to receive an input sense signal $U_{INS}$ 142 representative of input voltage $V_{IN}$ 102 and an output sense signal $U_{OS}$ 132 representative of output quantity $U_O$ 153. In one example, power supply 100 may include an input sense circuit 140 coupled to sense input voltage $V_{IN}$ 102 and produce input sense signal $U_{INS}$ 142 in response to input voltage $V_{IN}$ 102. Similarly, power supply 100 may include an output sense circuit 130 coupled to sense output quantity $U_O$ 153 and produce output sense signal $U_{OS}$ 132 in response to output quantity $U_O$ 153.

In one example, controller 150 may be implemented as a monolithic integrated circuit, with discrete electrical components, or using a combination of discrete and integrated circuits. In addition, controller 150 and power switch S1 170 may form a part of an integrated circuit that is manufactured as either a hybrid or a monolithic integrated circuit.

As further illustrated in the example depicted in FIG. 1A, controller 150 may include a feedback signal generator 152, a state selector circuit 154, and a driver circuit 156. In the illustrated example, feedback signal generator 152 is coupled to receive input sense signal $U_{INS}$ 142, output sense signal $U_{OS}$ 132, and sensed switch signal $U_{SSW}$ 144 to produce a feedback signal $U_{FB}$ 158 that is representative of output current $I_O$ 118 (i.e., current in load 122). In some cases, feedback signal generator 152 may be configured to generate feedback signal $U_{FB}$ 158 only in response to output sense signal $U_{OS}$ 132. In some other cases, feedback signal generator 152 may be configured to generate feedback signal $U_{FB}$ 158 in response to input sense signal $U_{INS}$ 142, output sense signal $U_{OS}$ 132, and sensed switch signal $U_{SSW}$ 144.

In the illustrated example, state selector circuit 154 is coupled to receive feedback signal $U_{FB}$ 158. In response, state selector circuit 154 outputs an N bit digital signal illustrated as a state signal $U_{ST}$ 160. In some cases, state selector circuit 154 may also be coupled to receive input sense signal $U_{INS}$ 142. In operation, state selector circuit 154 gathers information regarding certain properties of feedback signal $U_{FB}$ 158, which may also be referred to as feedback information, at a sampling frequency for a feedback period and adjusts state signal $U_{ST}$ 160 in response to the feedback information at the end of the feedback period. In general, the feedback period is several times greater than the period of a clock signal used to sample feedback signal $U_{FB}$ 158. In other words, the feedback period may be several times greater than a sampling period of feedback signal $U_{FB}$ 158. For instance, in one example, the feedback period can be half of the period of the ac line voltage (i.e., half line cycle) and feedback signal $U_{FB}$ 158 can be sampled 512 times during each feedback period. That is, the feedback period can be 512 times greater than the sampling period. In another example, the feedback period can be equal to the period of the ac line voltage. Additionally, the feedback period may be several times greater than the switching period of power switch S1 170. That is, power switch S1 170 may be switched between the ON state and the OFF state several times (e.g., 1000 times) during the feedback period.

As shown in the example depicted in FIG. 1A, driver circuit 156 is coupled to receive state signal $U_{ST}$ 160 and output a drive signal $U_{DR}$ 162 to drive the switching of power switch S1 170 such that an operating condition such as on-time and/or switching frequency of power switch S1 170 is set according to an operational state indicated by state signal $U_{ST}$ 160. In one example, each one of $2^N$ possible values of state signal $U_{ST}$ 160 may represent a different operational state (i.e., a different on-time and/or switching frequency) for power switch S1 170. As previously mentioned, in one example, state selector circuit 154 does not adjust state signal $U_{ST}$ 160 until the end of a feedback period. This also means that driver circuit 156 does not adjust drive signal $U_{DR}$ 162 until the end of the feedback period. In other words, the operational state (hence, the operating condition of power switch S1 170) is maintained for the entire feedback period in one example in accordance with the teachings of the present invention.

Figure 1B:
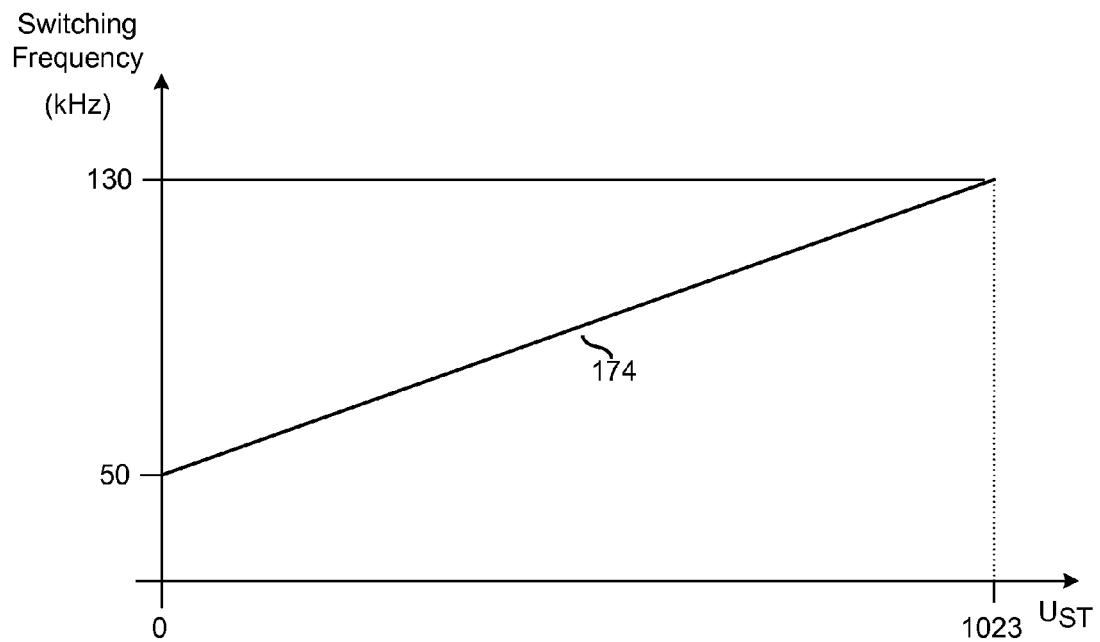
FIG. 1B shows examples of relationships of switching frequency with respect to a state signal of an example switch mode power converter including a controller in accordance with the teachings of the present invention.
Figure 1B:
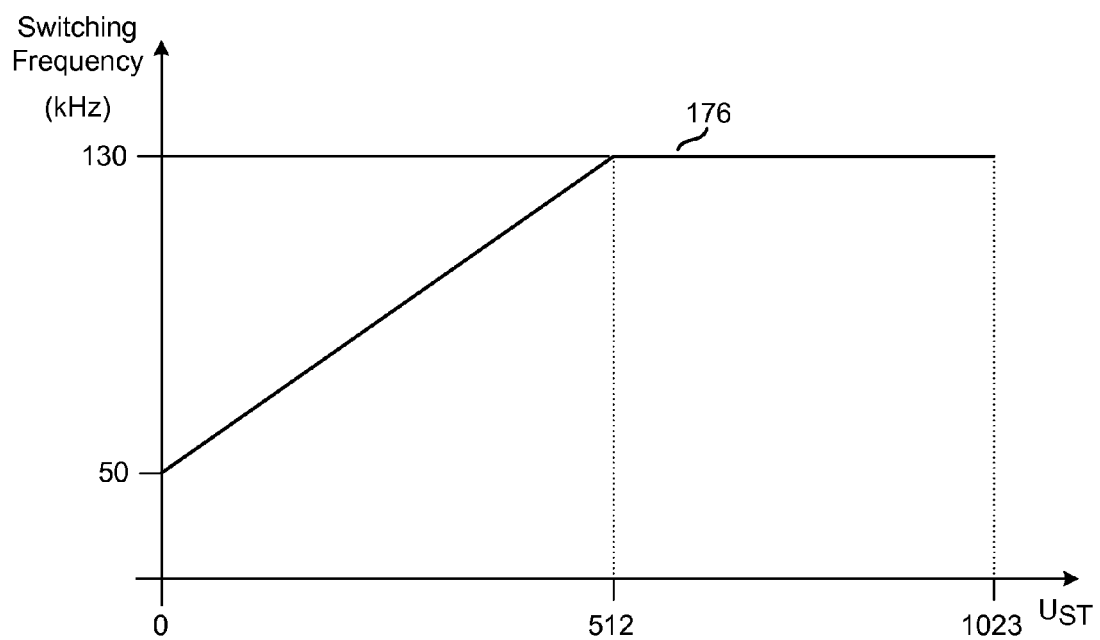

FIG. 1B shows examples of relationships of switching frequency of power switch S1 170 with respect to state signal $U_{ST}$ 160 of FIG. 1A in accordance with the teachings of the present invention. As shown in relationship 174 depicted in FIG. 1B, the switching frequency of power switch S1 170 varies with state signal $U_{ST}$ 160. Specifically, state signal $U_{ST}$ 160 shown in FIG. 1A may be a 10 bit digital signal ranging from 0 to 1023, and the switching frequency of power switch S1 170 may increase (e.g., from 50 kHz to 130 kHz) as state signal $U_{ST}$ 160 increases (e.g., from 0 to 1023). In another example, as shown in relationship 176, the switching frequency of power switch S1 170 may increase (e.g., from 50 kHz to 130 kHz) as state signal $U_{ST}$ 160 increases until reaching a certain value (e.g., until state signal $U_{ST}$ 160 reaches 512) and may remain at a constant switching frequency (e.g., 130 kHz) for greater values of state signal $U_{ST}$ 160. It should be noted of course that FIG. 1B provides examples for explanation purposes and that other similar relationships may also exist between the on-time of power switch S1 170 and state signal $U_{ST}$ 160 in accordance with the teachings of the present invention.

Referring back to the example controller 150 depicted in FIG. 1A, the example state selector circuit 154 may adjust state signal $U_{ST}$ 160 by an amount that is based on an operation mode of state selector circuit 154. In the illustrated example, the operation mode of state selector circuit 154 is determined according to the feedback information at the end of a feedback period. For instance, in response to the feedback information at the end of a feedback period, state selector circuit 154 may be operating in a coarse mode of operation. In this coarse mode, state selector circuit 154 may update the sixth bit of state signal $U_{ST}$ 160 in response to the feedback information. That is, in the coarse mode, state selector circuit 154 may increase state signal $U_{ST}$ 160 by 32 (i.e., 0000100000 binary) if the feedback information indicates that state selector circuit 154 should increase state signal $U_{ST}$ 160 and decrease state signal $U_{ST}$ 160 by 32 (i.e., 0000100000 binary) if the feedback information indicates that state selector circuit 154 should decrease state signal $U_{ST}$ 160.

Similarly, in response to feedback information at the end of the feedback period, state selector circuit 154 may be operating in a fine mode of operation, and update the first bit, or least significant bit, of state signal $U_{ST}$ 160. In other words, in the fine mode, state selector circuit 154 may increase or decrease state signal $U_{ST}$ 160 by 1 (i.e., 0000000001 binary) in response to the feedback information. In one example, this means that state selector circuit 154 may adjust state signal $U_{ST}$ 160 such that the rate of change in state signal $U_{ST}$ 160 (hence, the rate of change in the operating condition of power switch S1 170) over multiple feedback periods in the fine mode of operation is less than the rate of change in state signal $U_{ST}$ 160 over multiple feedback periods in the coarse mode of operation. In this manner, state selector circuit 154 may vary the resolution of changes made to state signal $U_{ST}$ 160 and thus, may vary the rate of change in power delivery over multiple feedback periods to load 122 in response to the feedback information in accordance with the teachings of the present invention. For example, if the feedback information indicates to state selector circuit 154 that the rate of change (i.e., rate of increase or rate of decrease) in power delivery over multiple feedback periods to load 122 should be greater, state selector circuit 154 may operate in the coarse mode and update state signal $U_{ST}$ 160, which therefore updates the operating condition of power switch S1 170 by a greater amount in accordance with the teachings of the present invention.

In the depicted example, the feedback information may include a first information that may represent a difference between a portion of a feedback period that feedback signal $U_{FB}$ 158 is less than a threshold value, and a portion of the feedback period that feedback signal $U_{FB}$ 158 is greater than the threshold value. The feedback information may also include a second information that may represent a difference between a portion of a feedback period that feedback signal $U_{FB}$ 158 is less than a lower limit and a portion of the feedback period that feedback signal $U_{FB}$ 158 is greater than an upper limit. In one example, the threshold value may represent a desired level of regulated output current $I_O$ 118 at the output of power supply 100. The lower limit may represent a level of output current $I_O$ 118 that is below the desired level (e.g., 10% below the desired level) and the upper limit may represent a level of output current $I_O$ 118 that is above the desired level (e.g., 10% above the desired level). In some applications, the first information may represent a difference between an estimated average value of feedback signal $U_{FB}$ 158 and the threshold value. In one example, state selector circuit 154 may use the first information and/or the second information to determine an operational state and hence, set an operating condition of power switch S1 170 accordingly.

For example, if the portion of a feedback period that feedback signal $U_{FB}$ 158 is less than the threshold value is greater than the portion of the feedback period that feedback signal $U_{FB}$ 158 is greater than the threshold value by a certain amount, state selector circuit 154 may determine that the power delivery to load 122 per unit time should be increased by a greater amount to more quickly bring output current $I_O$ 118 closer to the desired level. In this case, state selector circuit 154 may operate in the coarse mode. However, once the portion of a feedback period that feedback signal $U_{FB}$ 158 is less than the threshold value approaches the portion of the feedback period that feedback signal $U_{FB}$ 158 is greater than the threshold value (e.g., the difference between the portion of a feedback period that feedback signal $U_{FB}$ 158 is less than the threshold value and the portion of the feedback period that feedback signal $U_{FB}$ 158 is greater than the threshold value falls within a certain range), state selector circuit 154 may determine that changes to the power delivery to load 122 should be made with finer resolution. In this case, state selector circuit 154 may operate in the fine mode. In this way, controller 150 can be configured to respond more rapidly to larger transients and remain less responsive to smaller disturbances at the input and/or the output of power supply 100 in accordance with the teachings of the present invention.

Figure 2A:
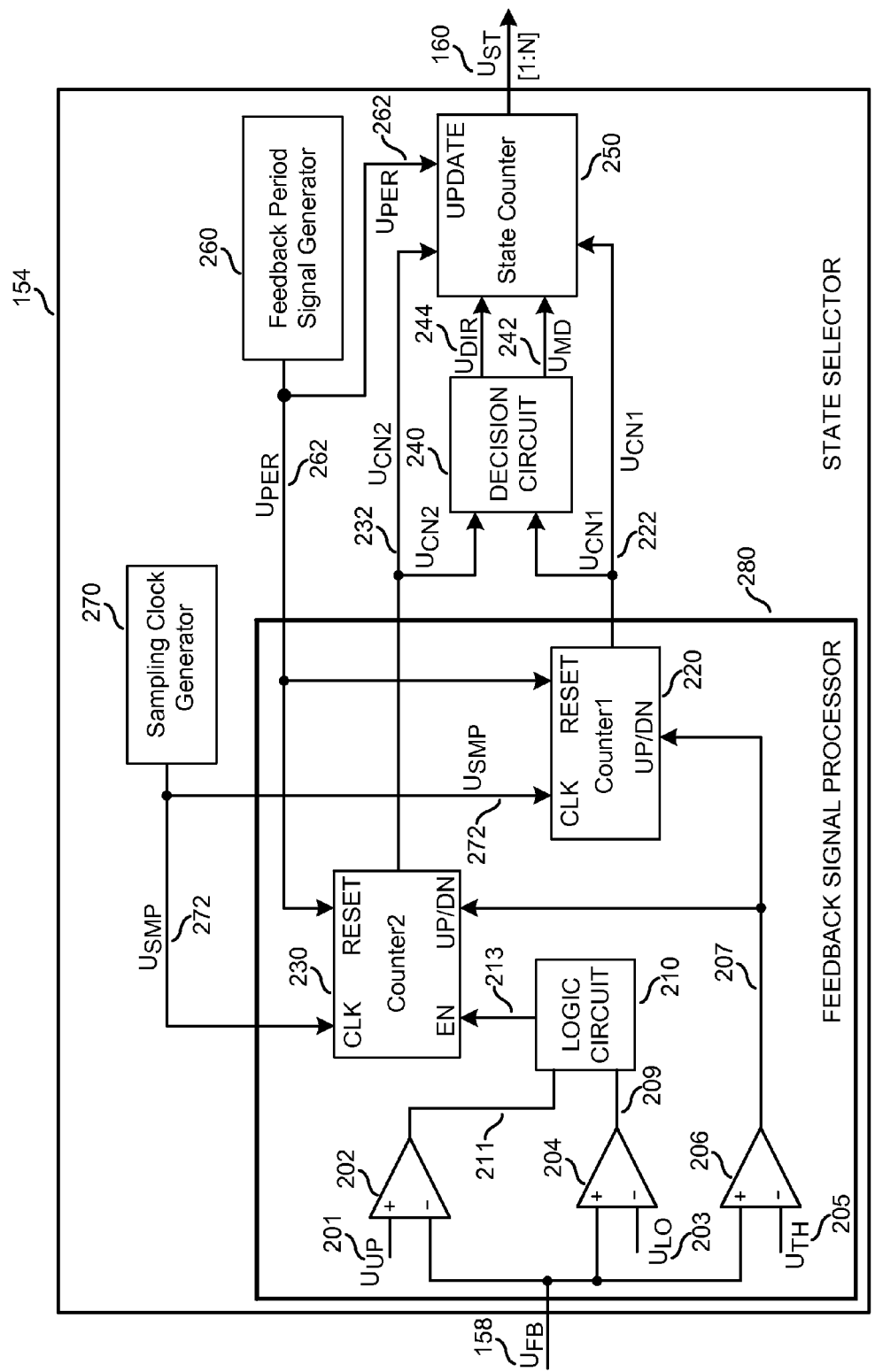
FIG. 2A shows a circuit diagram illustrating one example of the state selector circuit of the controller in FIG. 1A in accordance with the teachings of the present invention.

FIG. 2A shows a circuit diagram illustrating one example of the state selector circuit 154 of the controller 150 in FIG. 1A with increased detail in accordance with the teachings of the present invention. It should be appreciated that similarly named and numbered elements referenced below are coupled and function as described above. As shown, state selector circuit 154 includes a feedback signal processor 280 that is coupled to receive feedback signal $U_{FB}$ 158, a sampling signal $U_{SMP}$ 272, and a feedback period signal $U_{PER}$ 262. In response, feedback signal processor 280 outputs a first count signal $U_{CN1}$ 222 corresponding to the first information and a second count signal $U_{CN2}$ 232 corresponding to the second information.

As will be shown, in one example, during a feedback period that is demarcated by feedback period signal $U_{PER}$ 262, feedback signal processor 280 compares feedback signal $U_{FB}$ 158 with a threshold $U_{TH}$ 205, an upper limit $U_{UP}$ 201, and a lower limit $U_{LO}$ 203 at a sampling frequency that is determined by the frequency of sampling signal $U_{SMP}$ 272. Feedback signal processor 280 updates first count signal $U_{CN1}$ 222 and second count signal $U_{CN2}$ 232 based on the results of the comparisons during the feedback period. In the illustrated example, threshold $U_{TH}$ 205 corresponds to the threshold value (i.e., desired value of output current $I_O$ 118), lower limit $U_{LO}$ 203 corresponds to the lower limit, and upper limit $U_{UP}$ 201 corresponds to the upper limit.

The example of FIG. 2A shows state selector 154 including a feedback period signal generator 260 that generates feedback period signal $U_{PER}$ 262 and a sampling clock generator 270 that generates sampling signal $U_{SMP}$ 272. In one example, feedback period signal generator 260 may output a pulse at set intervals (i.e., a periodic pulse with a certain period) as feedback period signal $U_{PER}$ 262. Each one of the intervals (i.e., the period of feedback period signal $U_{PER}$ 262) demarcates a feedback period. Stated differently, feedback period signal $U_{PER}$ 262 can indicate the beginning and the end of a feedback period. In one example, the period of feedback period signal $U_{PER}$ 262 (i.e., the feedback period) may be equal to one half of the period the ac line voltage, which may be several times (e.g., 512) greater than the period of sampling signal $U_{SMP}$ 272 (i.e., the sampling period). In other words, feedback signal processor 280 may update first count signal $U_{CN1}$ 222 and second count signal $U_{CN2}$ 232 512 times during every feedback period. Additionally, feedback signal processor 280 may set first count signal $U_{CN1}$ 222 to a first initial value and second count signal $U_{CN2}$ 232 to a second initial value at the beginning of each feedback period. In the depicted example, the first initial value and the second initial value may be the same and equal to zero. In some cases, the first initial value may be different from the second initial value.

As further illustrated in the example depicted in FIG. 2A, feedback signal processor 280 includes a first counter Counter1 220, a second counter Counter2 230, a logic circuit 210, and comparators 202, 204, and 206. First counter Counter1 220 is coupled to receive sampling signal $U_{SMP}$ 272 at its CLK input, feedback period signal $U_{PER}$ 262 at its RESET input, an output 207 of comparator 206 at its UP/DN input. First counter Counter1 220 is also coupled to output first count signal $U_{CN1}$ 222. In operation, first counter Counter1 220 updates first count signal $U_{CN1}$ 222 by counting up or down in response to output 207 during every sampling period. In one example, first counter Counter1 220 counts up if output 207 is logic low and counts down if output 207 is logic high. Comparator 206 is coupled to receive feedback signal $U_{FB}$ 158 and set output 207 to logic high or logic low in response to a comparison of feedback signal $U_{FB}$ 158 with threshold $U_{TH}$ 205. In one example, comparator 206 may set output 207 to logic high if feedback signal $U_{FB}$ 158 is greater than threshold $U_{TH}$ 205, and set output 207 to logic low if feedback signal $U_{FB}$ 158 is less than threshold $U_{TH}$ 205. First counter Counter1 220 may increase first count signal $U_{CN1}$ 222 by counting up when feedback signal $U_{FB}$ 158 is less than threshold $U_{TH}$ 205 during a sampling period and similarly, may decrease first count signal $U_{CN1}$ 222 by counting down when feedback signal $U_{FB}$ 158 is greater than threshold $U_{TH}$ 205 during a sampling period. In this way, first counter Counter1 220 may output as first count signal $U_{CN1}$ 222 a signal that may be representative of the difference between a portion of a feedback period that feedback signal $U_{FB}$ 158 is less than threshold $U_{TH}$ 205 and a portion of the feedback period that feedback signal $U_{FB}$ 158 is greater than threshold $U_{TH}$ 205.

Continuing with the example depicted in FIG. 2A, second counter Counter2 230 is coupled to receive sampling signal $U_{SMP}$ 272 at its CLK input, feedback period signal $U_{PER}$ 262 at its RESET input, output 207 of comparator 206 at its UP/DN input, an output 213 of logic circuit 210 at its EN input. Second counter Counter2 230 is further coupled to output second count signal $U_{CN2}$ 232. In operation, second counter Counter2 230 updates second count signal $U_{CN2}$ 232 by counting up or down in response to output 207 during every sampling period if output 213 indicates that second counter 230 should be enabled, and maintains second count signal $U_{CN2}$ 232 at the same value if output 213 indicates that second counter Counter2 230 should be disabled. In one example, logic circuit 210 may be a two-input XOR gate coupled to receive an output 211 of comparator 202 and an output 209 of comparator 204 as inputs. As such, output 213 may be logic low indicating that second counter Counter2 230 should be disabled when output 211 and 209 are both logic low or are both logic high. Output 213 may be logic high indicating that second counter Counter2 230 should be enabled when only one of outputs 209 and 211 is logic high and the other one of outputs 209 and 211 is logic low.

In the depicted example, comparators 202 and 204 are coupled to receive feedback signal $U_{FB}$ 158 and set outputs 211 and 209 in response to the comparisons of feedback signal $U_{FB}$ 158 with upper limit $U_{UP}$ 201 and with lower limit $U_{LO}$ 203, respectively. Specifically, comparator 202 sets output 211 to logic high if feedback signal $U_{FB}$ 158 is less than upper limit $U_{UP}$ 201 and to logic low if feedback signal $U_{FB}$ 158 is greater than upper limit $U_{UP}$ 201. Similarly, comparator 204 sets output 209 to logic high if feedback signal $U_{FB}$ 158 is greater than lower limit $U_{LO}$ 203 and to logic low if feedback signal $U_{FB}$ 158 is less than lower limit $U_{LO}$ 203. In other words, second counter Counter2 230 is enabled to count up or down in response to output 207 when feedback signal $U_{FB}$ 158 is greater than upper limit $U_{UP}$ 201 or less than lower limit $U_{LO}$ 203 during a sampling period. When feedback signal $U_{FB}$ 158 is between upper limit $U_{UP}$ 201 and lower limit $U_{LO}$ 203, however, second counter Counter2 230 is disabled and keeps second count signal $U_{CN2}$ 232 constant.

In the example, when enabled, second counter Counter2 230 increases second count signal $U_{CN2}$ 232 by counting up if output 207 is logic low and decreases second count signal $U_{CN2}$ 232 by counting down if output 207 is logic high. That is, second counter Counter2 230 counts up when feedback signal $U_{FB}$ 158 is less than lower limit $U_{LO}$ 203 during a sampling period. Second counter Counter2 230 counts down when feedback signal $U_{FB}$ 158 is greater than upper limit $U_{UP}$ 201 during a sampling period. In this way, second counter Counter2 230 may output as second count signal $U_{CN2}$ 232 a signal that may be representative of the difference between a portion of a feedback period that feedback signal $U_{FB}$ 158 is less than lower limit $U_{LO}$ 203 and a portion of the feedback period that feedback signal $U_{FB}$ 158 is greater than upper limit $U_{UP}$ 201. In one example, both first counter Counter1 220 and second counter Counter2 230 are configured to have a maximum output count that is representative of a length of time corresponding to a feedback period. The magnitudes of first count signal $U_{CN1}$ 222 and second count signal $U_{CN2}$ 232 cannot exceed the maximum output count.

As further shown, state selector circuit 154 also includes a decision circuit 240 and a state counter 250. Decision circuit 240 is coupled to receive first count signal $U_{CN1}$ 222 and second count signal $U_{CN2}$ 232 from feedback signal processor 280 and output a direction signal $U_{DIR}$ 244 and a mode signal $U_{MD}$ 242. In one example, direction signal $U_{DIR}$ 244 may be a one-bit digital signal indicative of the direction of change in state signal $U_{ST}$ 160 and mode signal $U_{MD}$ 242 may be a two-bit digital signal indicative of an operation mode of state selector circuit 154. In operation, decision circuit 240 may set direction signal $U_{DIR}$ 244 to zero or one in response to first count signal $U_{CN1}$ 222, and mode signal $U_{MD}$ 242 to one of zero (i.e., 00 binary), one (i.e., 01 binary), and two (i.e., 10 binary) in response to both first count signal $U_{CN1}$ 222 and second count signal $U_{CN2}$ 232. In the illustrated example, decision circuit 240 may set direction signal $U_{DIR}$ 244 to one indicating that state signal $U_{ST}$ 160 should be increased when first count signal $U_{CN1}$ 222 is positive and set direction signal $U_{DIR}$ 244 to zero indicating that state signal $U_{ST}$ 160 should be decreased when first count signal $U_{CN1}$ 222 is negative.

Furthermore, decision circuit 240 may set mode signal $U_{MD}$ 242 to zero, which may correspond to a coarse mode as an operation mode if the magnitude of first count signal $U_{CN1}$ 222 is greater than a value X, the magnitude of second count signal $U_{CN2}$ 232 is greater than a value Y, and both first count signal $U_{CN1}$ 222 and second count signal $U_{CN2}$ 232 have the same sign (i.e., both signals are either positive or negative). Decision circuit 240 may set mode signal $U_{MD}$ 242 to one, which may correspond to a medium mode as an operation mode if the magnitude of first count signal $U_{CN1}$ 222 is greater than the value X, the magnitude of second count signal $U_{CN2}$ 232 is between the value Y and a value Z (less than the value Y), and both first count signal $U_{CN1}$ 222 and second count signal $U_{CN2}$ 232 have the same sign. Decision circuit 240 may set mode signal $U_{MD}$ 242 to two, which may correspond to a fine mode as an operation mode if the magnitude of first count signal $U_{CN1}$ 222 is less than the value X, or the magnitude of second count signal $U_{CN2}$ 232 is less than the value Z, or first count signal $U_{CN1}$ 222 and second count signal $U_{CN2}$ 232 have different signs. In one example, the value X represents a length of time that corresponds to 5% of a feedback period (i.e., the value X is equal to 5% of the maximum output count). In some cases, the value X may also correspond to 5% of the maximum value of the difference between an estimated average value of feedback signal $U_{FB}$ 158 and threshold $U_{TH}$ 205. The value Y represents a length of time that corresponds to 20% of a feedback period (i.e., the value Y is equal to 20% of the maximum output count) and the value Z represents a length of time that corresponds to 10% of a feedback period (i.e., the value Z is equal to 10% of the maximum output count).

As shown in the depicted example, state counter 250 is coupled to receive feedback period signal $U_{PER}$ 262 at its UPDATE input, direction signal $U_{DIR}$ 244, mode signal $U_{MD}$ 242, first count signal $U_{CN1}$ 222, second count signal $U_{CN2}$ 232. State counter is also coupled to output state signal $U_{ST}$ 160. In operation, state counter 250 may update state signal $U_{ST}$ 160 in response to the values of direction signal $U_{DIR}$ 244 and mode signal $U_{MD}$ 242 at the time that a new pulse in feedback period signal $U_{PER}$ 262 is received, which is indicative of the end of a presently occurring feedback period (i.e., the beginning of a new feedback period). For example, when the value of mode signal $U_{MD}$ 242 at the end of a presently occurring feedback period is zero, state selector circuit 154 is set to operate in the coarse mode. When state selector circuit 154 is in the coarse mode, state counter 250 may update (increase or decrease) the sixth bit of state signal $U_{ST}$ 160 (i.e., 0000100000 binary) in response to the value of direction signal $U_{DIR}$ 244 at the end of the presently occurring feedback period. That is, when state selector circuit 154 is operating in the coarse mode, state counter 250 may increase or decrease state signal $U_{ST}$ 160 by 32 for the next feedback period based on the value of direction signal $U_{DIR}$ 244 at the end of the presently occurring feedback period. In one example, state counter 250 increases state signal $U_{ST}$ 160 if direction signal $U_{DIR}$ 244 is one and decreases state signal $U_{ST}$ 160 if direction signal $U_{DIR}$ 244 is zero.

In another example, when the value of mode signal $U_{MD}$ 242 at the end of a presently occurring feedback period is one, state selector circuit 154 is set to operate in the medium mode. When state selector circuit 154 is in the medium mode, state counter 250 may update the fourth bit of state signal $U_{ST}$ 160 (i.e., 0000001000 binary) in response to the value of direction signal $U_{DIR}$ 244 at the end of the presently occurring feedback period. That is, when state selector circuit 154 is operating in the coarse mode, state counter 250 may increase or decrease state signal $U_{ST}$ 160 by eight for the next feedback period based on the value of direction signal $U_{DIR}$ 244 at the end of the presently occurring feedback period. In one example, state counter 250 increases state signal $U_{ST}$ 160 if direction signal $U_{DIR}$ 244 is one and decreases state signal $U_{ST}$ 160 if direction signal $U_{DIR}$ 244 is zero.

In yet another example, when the value of mode signal $U_{MD}$ 242 at the end of a presently occurring feedback period is two, state selector circuit 154 is set to operate in the fine mode. When state selector circuit 154 is in the fine mode, state counter 250 may update the first bit (least significant bit) of state signal $U_{ST}$ 160 (i.e., 0000000001 binary). In the depicted example, when state selector circuit 154 is operating in the fine mode, state counter 250 is configured to update state signal $U_{ST}$ 160 only if direction signal $U_{DIR}$ 244 and mode signal $U_{MD}$ 242 maintain their values, and the final values of both first count signal $U_{CN1}$ 222 and second count signal $U_{CN2}$ 232 at the end of a feedback period are above a minimum threshold count (e.g., 3) for a certain number (e.g., 12) of consecutive feedback periods. In one example, if this set of conditions is met and direction signal $U_{DIR}$ 244 is one, state counter 250 increases state signal $U_{ST}$ 160 by one. If this set of conditions is met but direction signal $U_{DIR}$ 244 is zero, state counter 250 decreases state signal $U_{ST}$ 160 by one. Conversely, if this set of conditions is not met such that direction signal $U_{DIR}$ 244 changes and/or at least one of the final values of first count signal $U_{CN1}$ 222 and second count signal $U_{CN2}$ 232 drops below the minimum threshold count, state counter 250 keeps state signal $U_{ST}$ 160 unchanged. For example, state counter 250 may include a counter that only operates when state selector circuit 154 is in the fine mode. The counter may be configured to start counting from one when state selector circuit 154 enters the fine mode and count up at the end of each feedback period if direction signal $U_{DIR}$ 244 maintains its value, and the final values of both first count signal $U_{CN1}$ 222 and second count signal $U_{CN2}$ 232 at the end of a feedback period are above the minimum threshold count. If direction signal $U_{DIR}$ 244 changes its value and/or at least one of the final values of first count signal $U_{CN1}$ 222 and second count signal $U_{CN2}$ 232 drops below the minimum threshold count, then the counter is reset to one and state signal $U_{ST}$ 160 remains unchanged. If direction signal $U_{DIR}$ 244 maintains its value, and the final values of both first count signal $U_{CN1}$ 222 and second count signal $U_{CN2}$ 232 remain above the minimum threshold count for 12 consecutive feedback periods (i.e., if the counter output reaches 12), state counter 250 updates state signal $U_{ST}$ 160 based on the value of direction signal $U_{DIR}$ 244 and sets the counter output back to one. It is in this manner that state selector circuit 154 can adjust the rate of change in the operating condition of power switch S1 170 (hence, the rate of change in power delivery to load 122) in response to the feedback information in accordance with the teachings of the present invention.

Figure 2B:
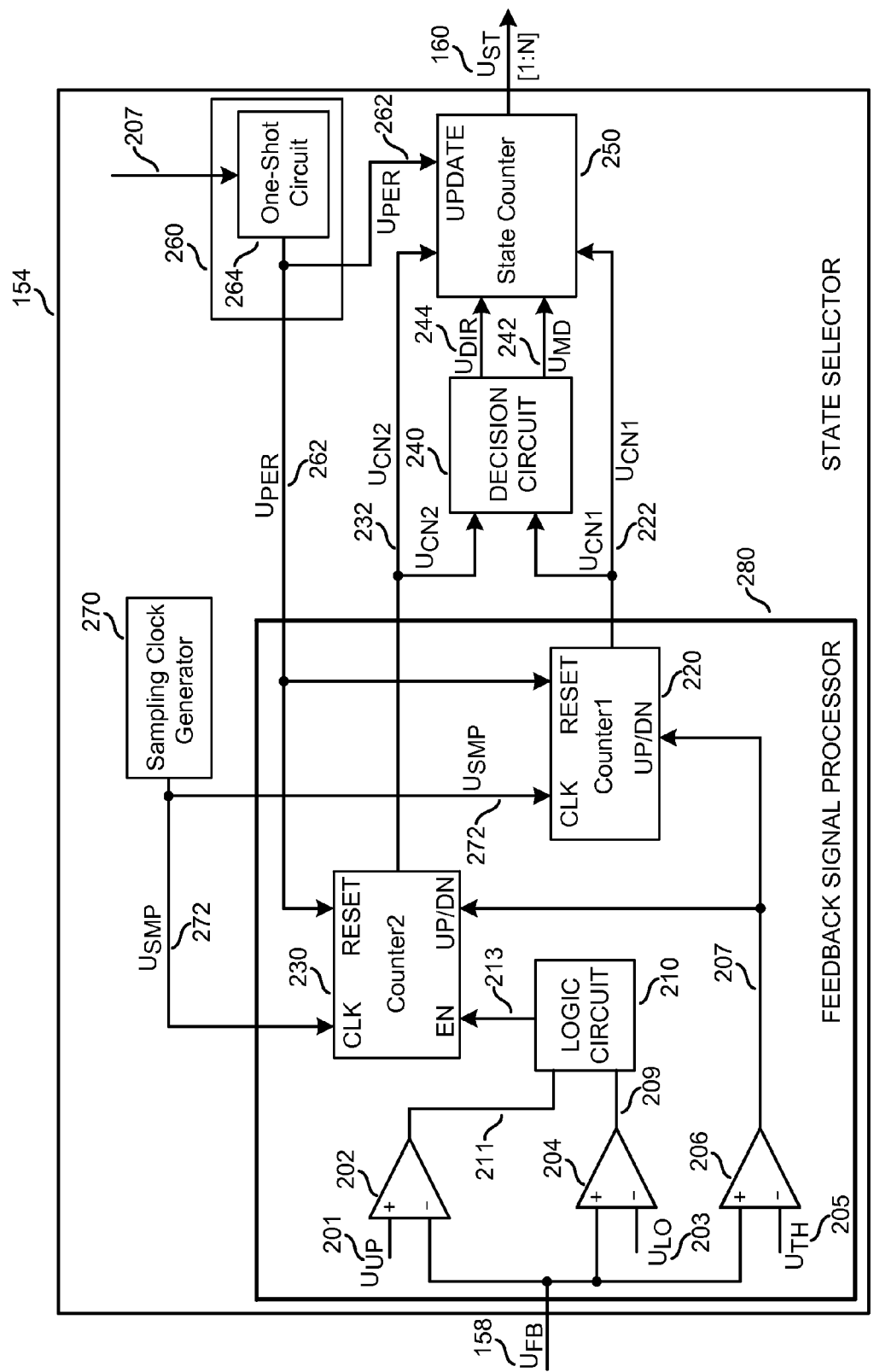
FIG. 2B shows a circuit diagram illustrating another example of the state selector circuit of the controller in FIG. 1A in accordance with the teachings of the present invention.

FIG. 2B shows a circuit diagram illustrating another example of the state selector circuit 154 of the controller 150 in FIG. 1A in accordance with the teachings of the present invention. It is noted that state selector circuit 154 in FIG. 2B shares similarities with state selector circuit 154 in FIG. 2A. It should be appreciated that similarly named and numbered elements referenced below are coupled and function as described above. One difference between state selector circuit 154 in FIG. 2B and state selector circuit 154 in FIG. 2A is that feedback period signal generator 260 in FIG. 2B includes a one-shot circuit 264 coupled to receive output 207 from comparator 206, and is therefore coupled to generate feedback period signal $U_{PER}$ 262 in response to the comparison of feedback signal $U_{FB}$ 158 with threshold $U_{TH}$ 205. One-shot circuit 264 is coupled to output a pulse in feedback period signal $U_{PER}$ 262 when output 207 transitions from logic high to logic low. In other words, feedback period signal generator 260 may output a pulse when feedback signal $U_{FB}$ 158 falls from a level above threshold $U_{TH}$ 205 to a level below threshold $U_{TH}$ 205. As such, each feedback period may correspond to a length of time between consecutive instances of feedback signal $U_{FB}$ 158 falling below threshold $U_{TH}$ 205. Additionally, feedback period signal generator 260 may be configured to output a pulse to terminate a feedback period if feedback signal $U_{FB}$ 158 does not fall below threshold $U_{TH}$ 205 within a certain length of time (e.g., a timeout period) from the start of the feedback period. For example, during startup, energy at the output of power supply 100 may be at a level such that feedback signal $U_{FB}$ 158 is below threshold $U_{TH}$ 205. In this case, feedback period signal generator 260 may output a pulse every timeout period to indicate that a presently occurring feedback period has ended and a new feedback period has begun. That is, each feedback period may be equal to the timeout period.

Figure 2C:
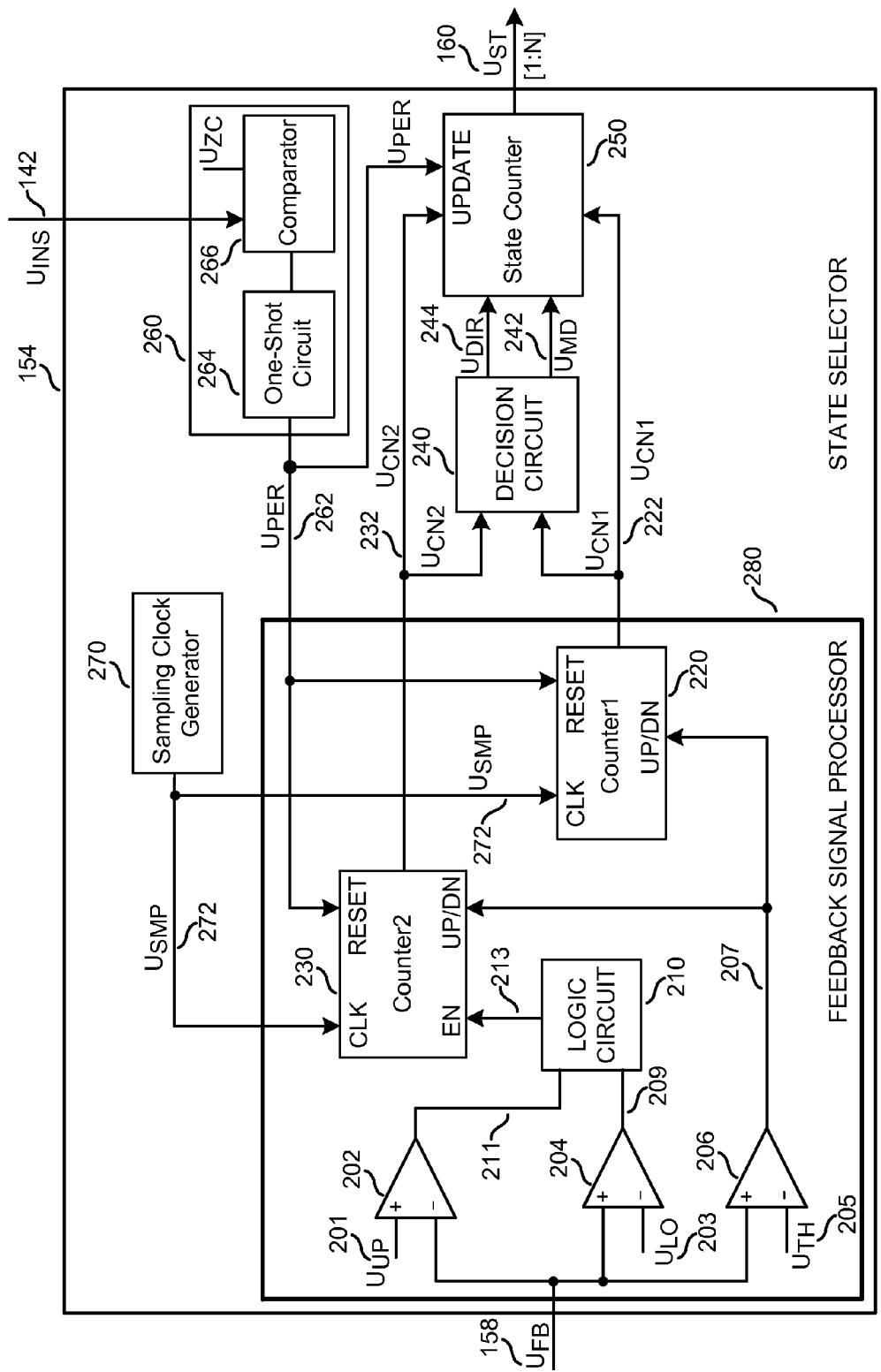
FIG. 2C shows a circuit diagram illustrating yet another example of the state selector circuit of the controller in FIG. 1A in accordance with the teachings of the present invention.

FIG. 2C shows a circuit diagram illustrating yet another example of the state selector circuit 154 of the controller 150 in FIG. 1A in accordance with the teachings of the present invention. It is noted that selector circuit 154 in FIG. 2C shares similarities with state selector circuit 154 in FIG. 2A. It should be appreciated that similarly named and numbered elements referenced below are coupled and function as described above. One difference between state selector circuit 154 in FIG. 2C and state selector circuit 154 in FIG. 2A is that feedback period signal generator 260 in FIG. 2C includes a comparator 266 coupled to receive input sense signal $U_{INS}$ 142 and a one-shot circuit 264 coupled to comparator 266 to output feedback period signal $U_{PER}$ 262 in response to the output of comparator 266.

Specifically, in one example, comparator 266 may compare input sense signal $U_{INS}$ 142 with a zero condition threshold $U_{ZC}$, which may be representative of a zero crossing threshold for input voltage $V_{IN}$ 102. In response, comparator 266 may output a logic high or logic low signal. One-shot circuit 264 may be coupled to output a pulse in feedback period signal $U_{PER}$ 262 when the signal at the output of comparator 266 transitions from logic high to logic low. In one example, comparator 266 outputs a logic high signal if input sense signal $U_{INS}$ 142 is greater than zero condition threshold $U_{ZC}$ and a logic low signal if input sense signal $U_{INS}$ 142 is less than or equal to zero condition threshold $U_{ZC}$. In other words, feedback period signal generator 260 in FIG. 2C may output a pulse in feedback period signal $U_{PER}$ 262 when input sense signal $U_{INS}$ 142 crosses zero condition threshold $U_{ZC}$ from a level that is above the threshold to a level that is below the threshold, which may also be referred to as a zero crossing event. As such, each feedback period may correspond to a length of time between consecutive zero crossing events.

Figure 3A:
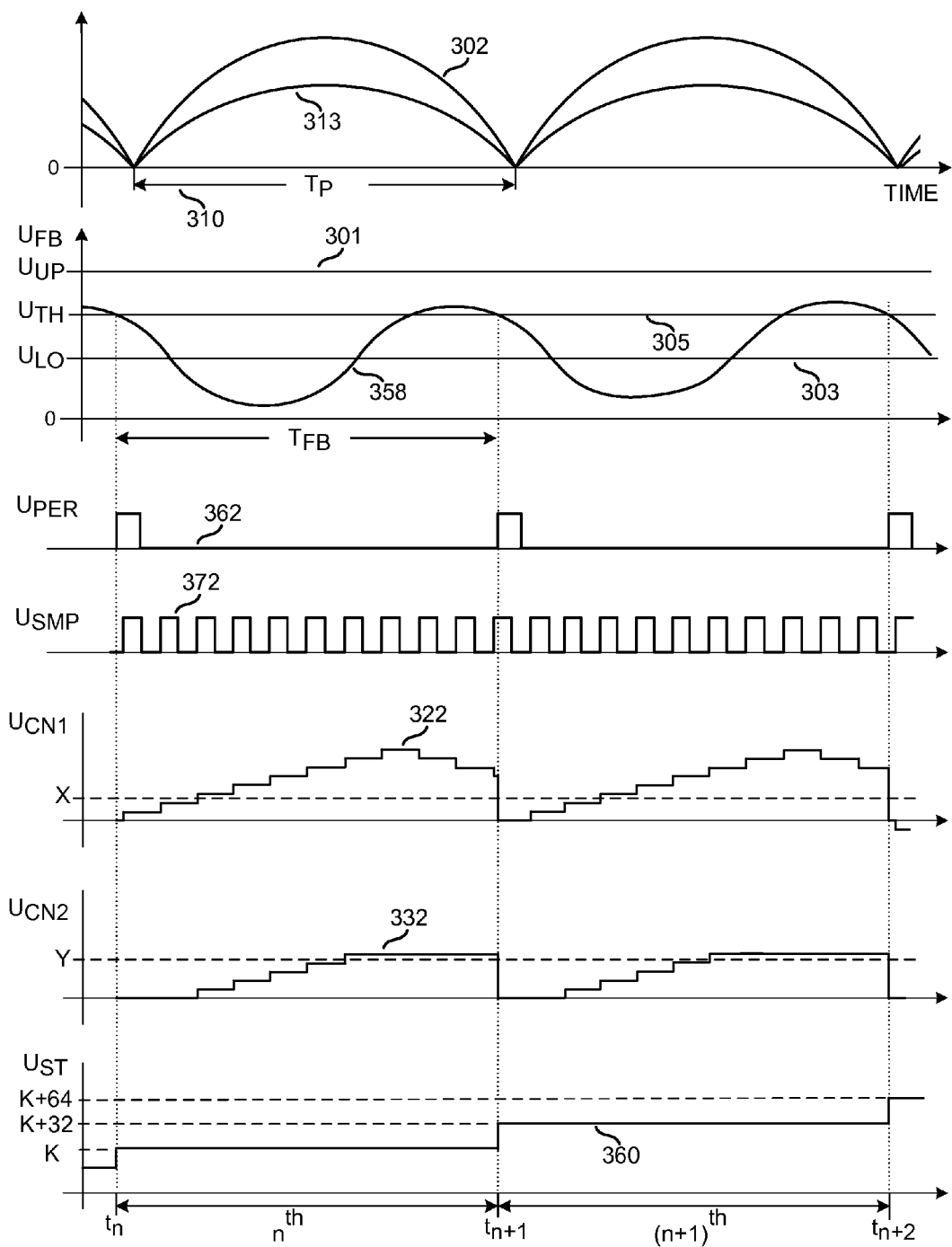
FIG. 3A shows an example set of waveforms illustrating the operation of the controller in FIG. 1A in accordance with the teachings of the present invention.

FIG. 3A shows an example set of waveforms illustrating the operation of the controller 150 in FIG. 1A in accordance with the teachings of the present invention. In the illustrated example, waveform 302 is a rectified periodic signal with a period $T_P$ 310 and may be representative of input voltage $V_{IN}$ 102. Waveform 313 is a periodic signal with period $T_P$ 310 and may be representative of input current $I_{IN}$ 113. As shown in the example, waveform 313 is in phase with and proportional to waveform 302. Waveform 358 is an example waveform representative of feedback signal $U_{FB}$ 158. In one example, waveform 358 may be representative of output current $I_O$ 118 that is provided to load 122 of power supply 100. As illustrated, waveform 358 is phase shifted with respect to waveform 313. This could be due to output capacitor C1 116 phase shifting output current $I_O$ 118 with respect to input current $I_{IN}$ 113. It should be noted that despite being phase shifted, waveform 358 may still be periodic with a period $T_{FB}$ that is substantially equal to the period of waveform 302 (i.e., period $T_P$ 310).

Further illustrated in FIG. 3A are waveform 362 and waveform 372. Waveform 362 may be representative of feedback period signal $U_{PER}$ 262 of FIGS. 2A-2C, and waveform 372 may be representative of sampling signal $U_{SMP}$ 272 of FIGS. 2A-2C. In the illustrated example, waveform 362 includes pulses that are generated in response to waveform 358 falling from a level above a value 305 to a level below value 305. Value 305 may correspond to threshold $U_{TH}$ 205 of FIGS. 2A-2C. Accordingly, in one example, the length of time between consecutive pulses in waveform 362 may correspond to a feedback period. For example, time points $t_n$, $t_{n+1}$, and $t_{n+2}$ may be the start and end points of consecutive feedback periods, with time point $t_n$ indicating the start of the $n^{th}$ feedback period, time point $t_{n+1}$ indicating the end of the $n^{th}$ feedback period and the start of the $(n+1)^{th}$ feedback period, and time point $t_{n+2}$ indicating the end of the $(n+1)^{th}$ feedback period and the start of the $(n+2)^{th}$ feedback period.

In the illustrated example, waveform 322 and 332 are representative of first count signal $T_{CN1}$ 222 and second count signal $U_{CN2}$ 232 of FIGS. 2A-2C, respectively, and may be updated every period of waveform 372 (i.e., every sampling period). Specifically, waveform 322 may be incremented if waveform 358 is less than value 305, and may be decremented if waveform 358 is greater than or equal to waveform 305. Waveform 332 may be incremented if waveform 358 is less than a value 303, which is representative of lower limit $U_{LO}$ 203, may be decremented if waveform 358 is greater than a value 301, which is representative of upper limit $U_{UP}$ 201, and may be kept unchanged if waveform 358 is between value 301 and value 303.

FIG. 3A also illustrates a waveform 360, which may be representative of state signal $U_{ST}$ 160. Final values of waveforms 322 and 332 at the end of a feedback period may be used to set the values of direction signal $U_{DIR}$ 244 and mode signal $U_{MD}$ 242 and in turn, update waveform 360 to adjust the operating condition of power switch S1 170 for the next feedback period. For instance, waveform 360 may be updated by a different amount depending on the set of conditions that is met by the final values of waveforms 322 and 332 during a feedback period. In addition, waveforms 322 and 332 may be set to an initial value such as, for example, zero at the beginning of each feedback period (e.g., at time points $t_n$, $t_{n+1}$, and $t_{n+2}$). This ensures that the final values of waveforms 322 and 332 at the end of a feedback period reflect only the feedback information gathered during that feedback period.

In the depicted example, at the end of the $n^{th}$ feedback period, the final value of waveform 322 is positive and greater than the value X, and final value of waveform 332 is positive and greater than the value Y. Under these conditions, in one example, direction signal $U_{DIR}$ 244 is set to one indicating that state signal $U_{ST}$ 160 should be increased and mode signal $U_{MD}$ 242 is set to zero indicating that state selector circuit 154 should operate in the coarse mode. As a result, waveform 360 is increased by 32 from a value K to a value (K+32) for $(n+1)^{th}$ feedback period. In the depicted example, the same set of conditions is met by waveforms 322 and 332 at the end of $(n+1)^{th}$ feedback period and thus, waveform 360 is again increased by 32 from value (K+32) to (K+64) for the next feedback period starting at time point $t_{n+2}$.

Figure 3B:
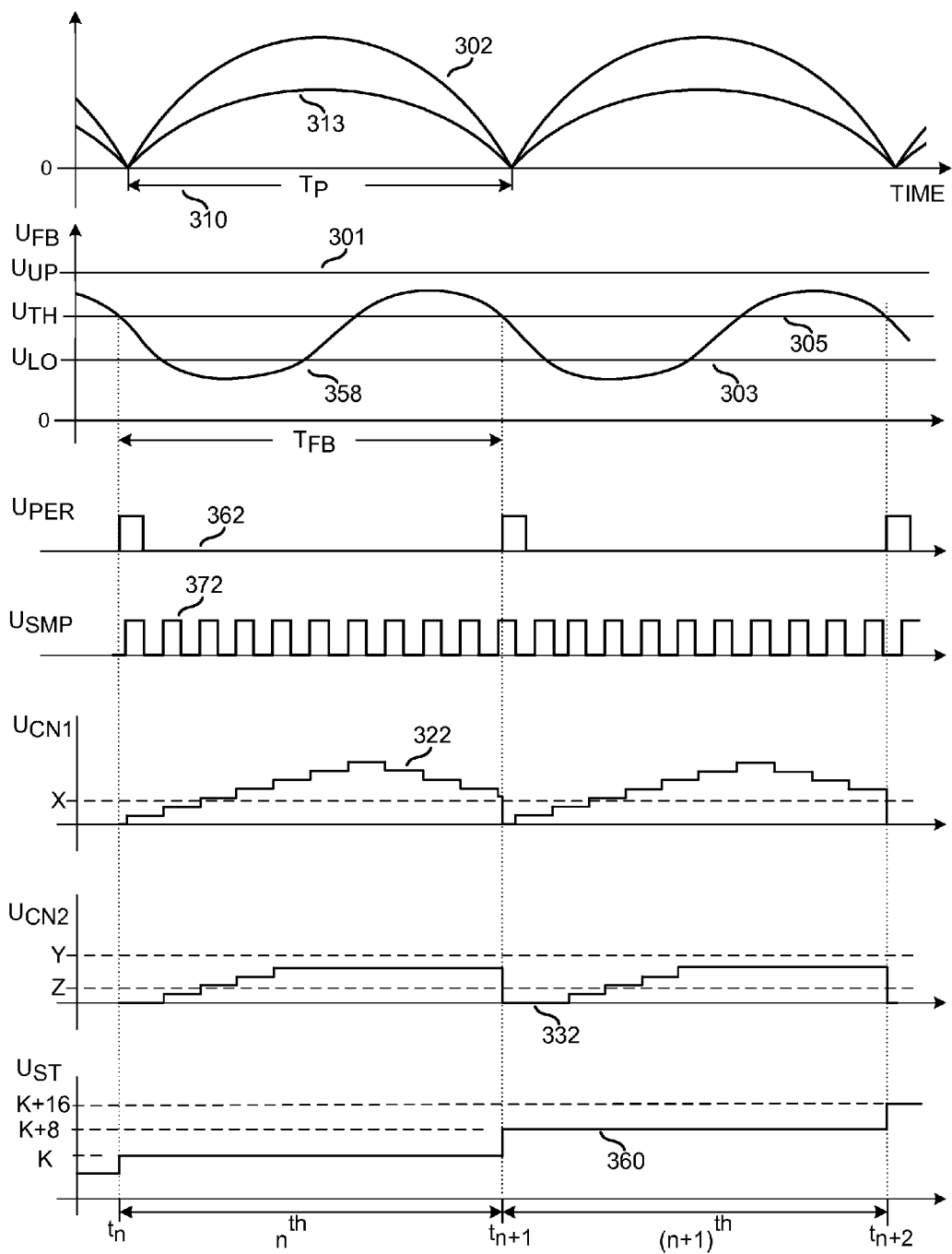
FIG. 3B shows another example set of waveforms illustrating the operation of the controller in FIG. 1A in accordance with the teachings of the present invention.

FIG. 3B shows another example set of waveforms illustrating the operation of controller 150 of FIG. 1A in accordance with the teachings of the present invention. One difference between waveform 358 in FIG. 3B and waveform 358 in FIG. 3A is that the final values of waveforms 322 and 332 in waveform 358 in FIG. 3B at the end of $n^{th}$ feedback period and $(n+1)^{th}$ feedback period satisfy a different set of conditions. Specifically, as shown in the example depicted in FIG. 3B at the end of $n^{th}$ feedback period, the final value of waveform 322 is positive and greater than the value X, and the final value of waveform 332 is positive and between the value Y and the value Z. In one example, the value Z is less than the value Y. Under these conditions, direction signal $U_{DIR}$ 244 is set to one indicating that state signal $U_{ST}$ 160 should be increased and mode signal $U_{MD}$ 242 is set to one indicating that state selector circuit 154 should operate in the medium mode. As a result, waveform 360 is increased by eight from value K to a value (K+8) for $(n+1)^{th}$ feedback period. In the depicted example, the same set of conditions holds at the end of $(n+1)^{th}$ feedback period. Therefore, waveform 360 is again increased by eight from value (K+8) to a value (K+16) for the next feedback period starting at time point $t_{n+2}$.

Figure 3C:
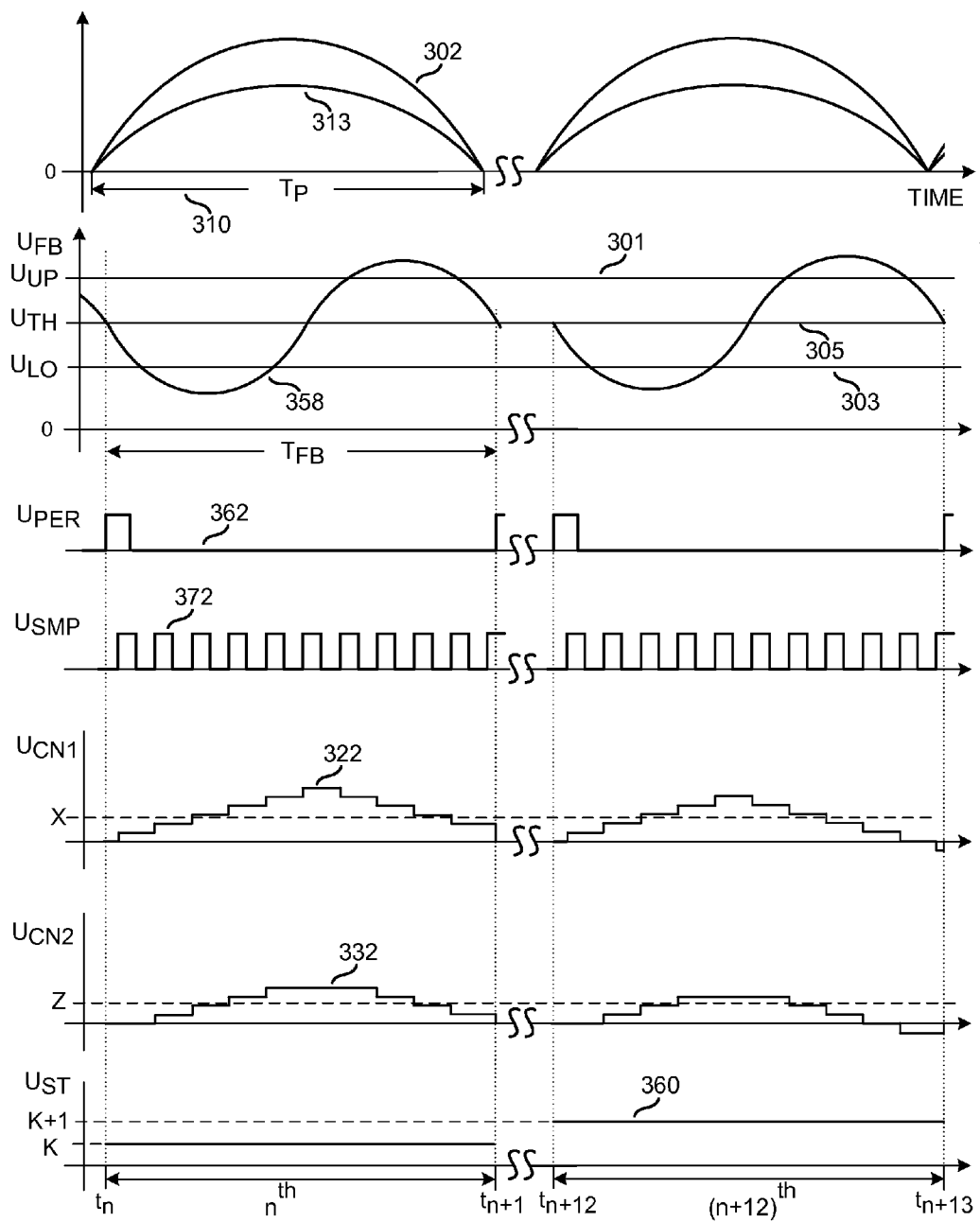
FIG. 3C shows yet another example set of waveforms illustrating the operation of the controller in FIG. 1A in accordance with the teachings of the present invention.

FIG. 3C shows yet another example set of waveforms illustrating the operation of controller 150 of FIG. 1A in accordance with the teachings of the present invention. One difference between waveform 358 of FIG. 3C and waveform 358 of FIG. 3A and FIG. 3B is that the final values of waveforms 322 and 332 in FIG. 3C at the end of the feedback periods from the $n^{th}$ feedback period through $(n+11)^{th}$ feedback period (not shown) satisfy a different set of conditions. Specifically, at the end of the $n^{th}$ feedback period, the final value of waveform 322 is positive and less than the value X, and the final value of waveform 332 is positive and less than the value Z. Under these conditions, direction signal $U_{DIR}$ 244 is set to one indicating that state signal $U_{ST}$ 160 should be increased and mode signal $U_{MD}$ 242 is set to two indicating that state selector circuit 154 should operate in the fine mode.

In one example, when operating in the fine mode, state selector circuit 154 updates state signal $U_{ST}$ 160 only if the values of direction signal $U_{DIR}$ 244 and mode signal $U_{MD}$ 242 remain the same, and both first count signal $U_{CN1}$ 222 and second count signal $U_{CN2}$ 232 are above the minimum threshold count for a certain number (e.g., 12) of consecutive feedback periods. In the illustrated example, the final values of waveforms 322 and 332 remain positive and below the value X and the value Z, respectively from $n^{th}$ feedback period through $(n+11)^{th}$ feedback period such that the values of direction signal $U_{DIR}$ 244 and mode signal $U_{MD}$ 242 remain at one and two, respectively for 12 consecutive feedback periods. Additionally, the values of first count signal $U_{CN1}$ 222 and second count signal $U_{CN2}$ 232 at the end of each feedback period remain above the minimum threshold count during this time. As a result, waveform 360 is increased by one from value K to a value (K+1) for $(n+12)^{th}$ feedback period starting at time point $t_{n+12}$.

Figure 4A:
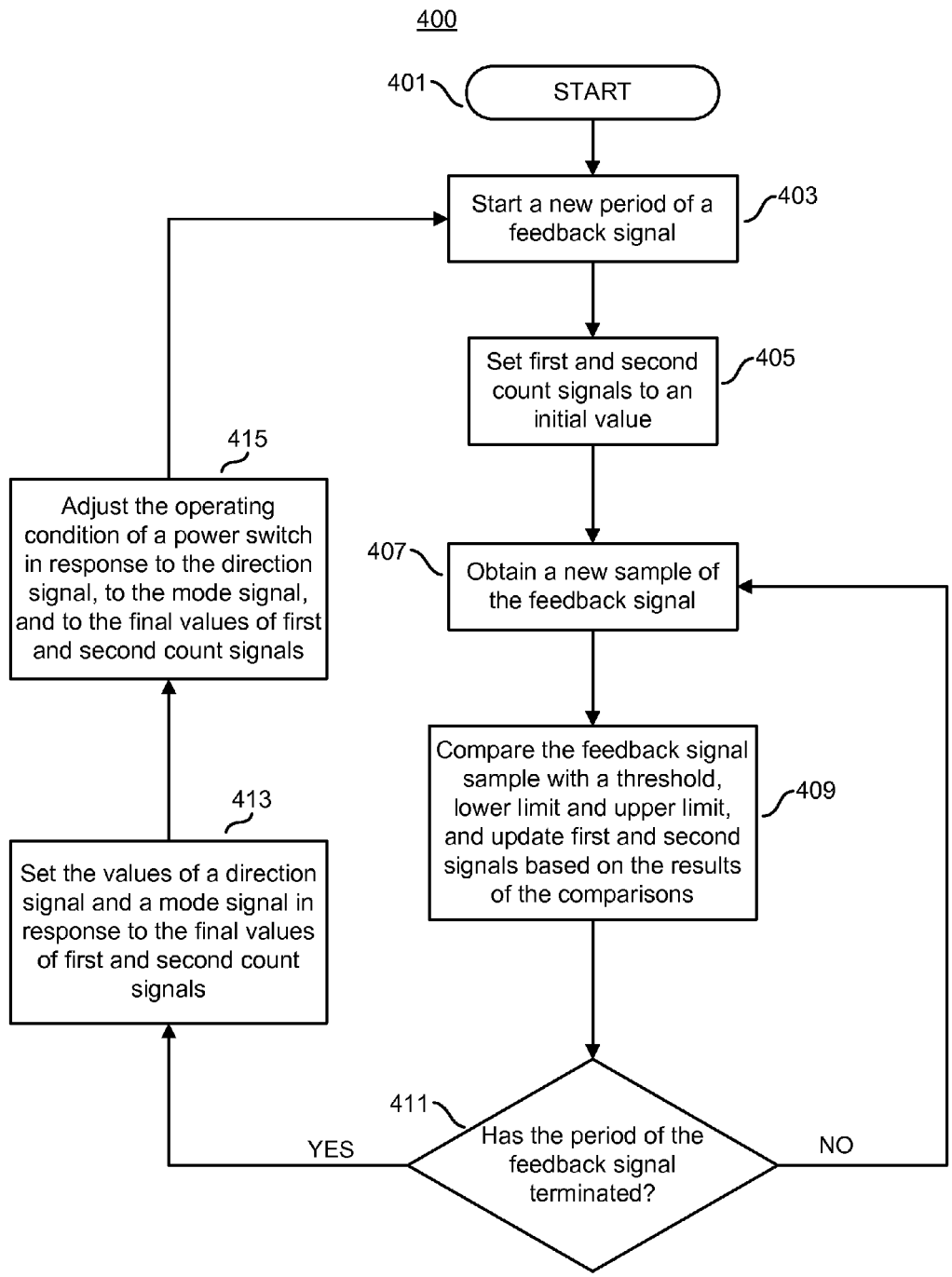
FIG. 4A shows a flow diagram illustrating an example process for adjusting the operating condition of a switch of a power supply in accordance with the teachings of the present invention.

FIG. 4A shows a flow diagram illustrating an example process 400 for adjusting the operating condition of a switch of a power supply in accordance with the teachings of the present invention. It is noted that process 400 may be performed by a circuit similar or identical to example state selector circuit 154 in FIG. 2A, FIG. 2B and in FIG. 2C in accordance with the teachings of the present invention. In the depicted example, process 400 may begin at block 401. At block 403, a new feedback period may be started. In one example, the feedback period may be started in response to a pulse in an indicator signal (e.g., feedback period signal $U_{PER}$ 262). For example, feedback period signal generator 260 may output pulses at set intervals as the indicator signal and each pulse may indicate the start of a new feedback period. Alternatively, feedback period signal generator 260 may output a pulse in response to feedback signal $U_{FB}$ 158 falling below a threshold (e.g., threshold $U_{TH}$ 205). At block 405, a first count signal (e.g., first count signal $U_{CN1}$ 222) and a second count signal (e.g., second count signal $U_{CN2}$ 232) may be set to an initial value (e.g., zero). In one example, the first count signal may be representative of the difference between a portion of a feedback period that feedback signal $U_{FB}$ 158 is less than the threshold and a portion of the feedback period that feedback signal $U_{FB}$ 158 is greater than the threshold. The first count signal may be generated by a counter (e.g., first counter Counter1 220). The second count signal may be representative of the difference between a portion of a feedback period that feedback signal $U_{FB}$ 158 is less than a lower limit (e.g., lower limit $U_{LO}$ 203) and a portion of the feedback period that feedback signal $U_{FB}$ 158 is greater than an upper limit (e.g., upper limit $U_{UP}$ 201). The second count signal may be generated by another counter (e.g., second counter Counter2 230). The first and the second count signals may be set to the initial value when the counters are reset in response to a pulse in the indicator signal.

At block 407, a new feedback sample (i.e., a new sample of feedback signal $U_{FB}$ 158) may be obtained. In one example, each feedback sample may be representative of the value of feedback signal $U_{FB}$ 158 during a corresponding sampling period. Each sampling period may be equal to the period of a clock signal (e.g., sampling signal $U_{SMP}$ 272) generated by a clock generator (e.g., sampling clock generator). In one example, the period of the clock signal may be several times (e.g., 512) smaller than the feedback period. In other words, feedback signal $U_{FB}$ 158 may be sampled several times (e.g., 512) during a feedback period.

At block 409, the feedback sample may be compared with the threshold, the lower limit and the upper limit. Then, the first and the second count signals may be updated based on these comparisons. More particularly, the first count signal may be changed in response to the comparison of the feedback sample with the threshold and the second count signal may be changed in response to the comparisons of the feedback sample with both the upper limit and the lower limit.

Figure 4B:
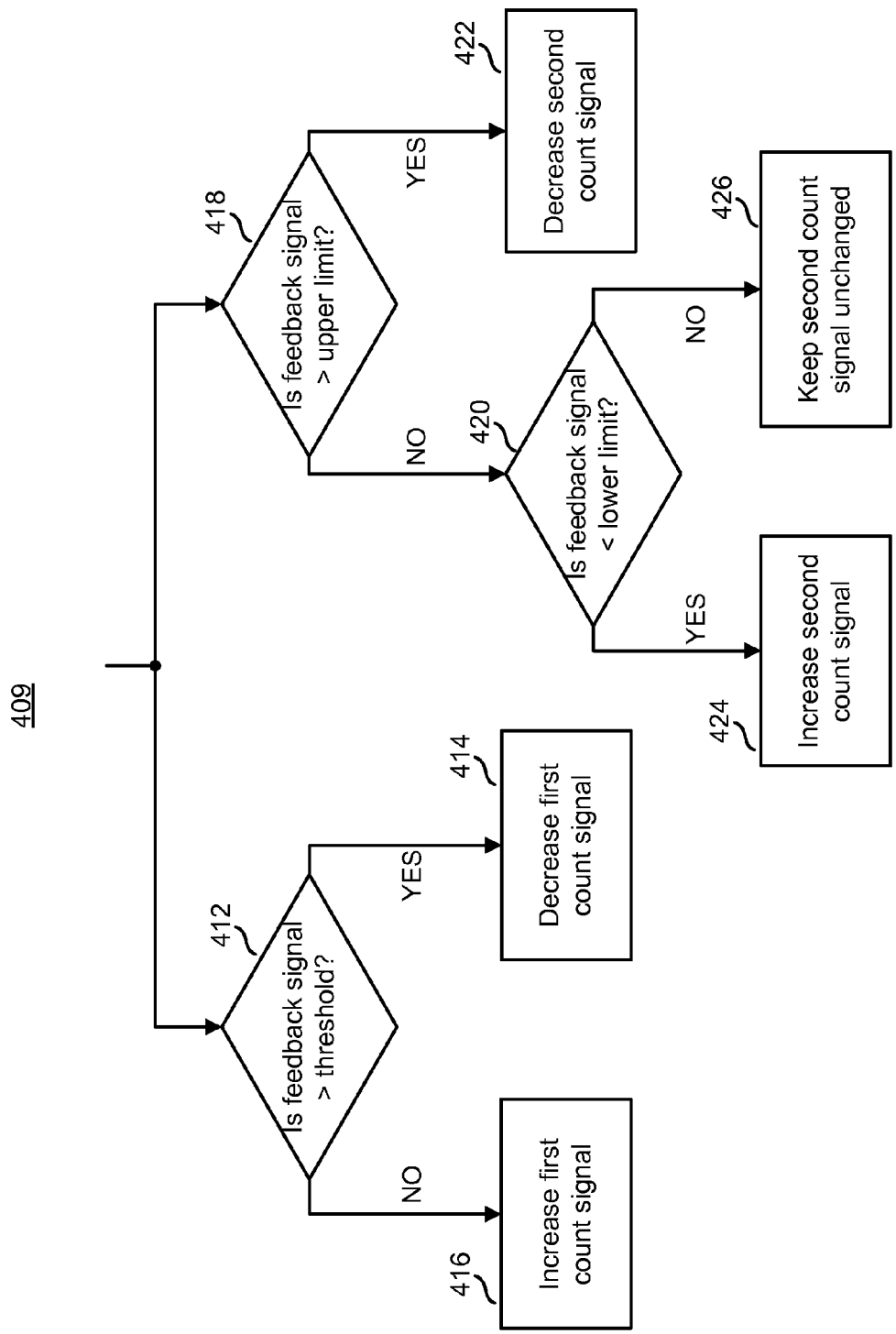
FIG. 4B shows a flow diagram illustrating one example of detailed steps of one the process blocks of the process shown in FIG. 4A in accordance with the teachings of the present invention.

FIG. 4B shows a flow diagram illustrating one example of detailed steps that may occur in process block 409 in accordance with the teachings of the present invention. For instance, examples of these comparisons and the resulting changes in the first and the second signals discussed on process block 409 of FIG. 4A are shown in detail. Referring now to FIG. 4B, at block 412, the feedback sample is compared with the threshold. If the sample is greater than the threshold, process 409 proceeds to block 414 where the first count signal is decremented. In one example, first counter Counter1 220 may decrement first count signal $U_{CN1}$ 222 by counting down. If the sample is not greater than the threshold, process 409 proceeds block 416 where the first count signal is incremented. In one example, first counter Counter1 220 increments first count signal $U_{CN1}$ 222 by counting up.

At block 418, the feedback sample is compared with the upper limit. If the sample is greater than the upper limit, process 409 proceeds to block 422 where the second count signal is decremented. In one example, second counter Counter2 230 decrements second count signal $U_{CN2}$ 232 by counting down. If the sample is not greater than the upper limit, process 409 proceeds to block 420 where the sample is compared with the lower limit. If the sample is less than the lower limit, process 409 proceeds to block 424 where the second count signal is incremented. In one example, second counter Counter2 230 increments second count signal $U_{CN2}$ 232 by counting up. If the sample is not less than the lower limit, process 409 proceeds to block 426 where the second count signal is kept unchanged.

Referring now back to FIG. 4A, at block 411, it may be determined whether or not the feedback period has ended. In one example, the feedback period may end in response to a new pulse in the indicator signal. If the feedback period has not ended, process 400 returns to block 407. Otherwise, if the feedback period has ended, process 400 proceeds to block 413.

At block 413, values of a direction signal (e.g., direction signal $U_{DIR}$ 244) and a mode signal (e.g., mode signal $U_{MD}$ 242) are set in response to the final values of the first and the second count signals at the end of the feedback period. In one example, state selector circuit 154 may include a decision circuit (e.g., decision circuit 240) coupled to receive the first and the second count signals and set the values of direction signal and the mode signal in response to the final values of the first and the second count signals.

Figure 4C:
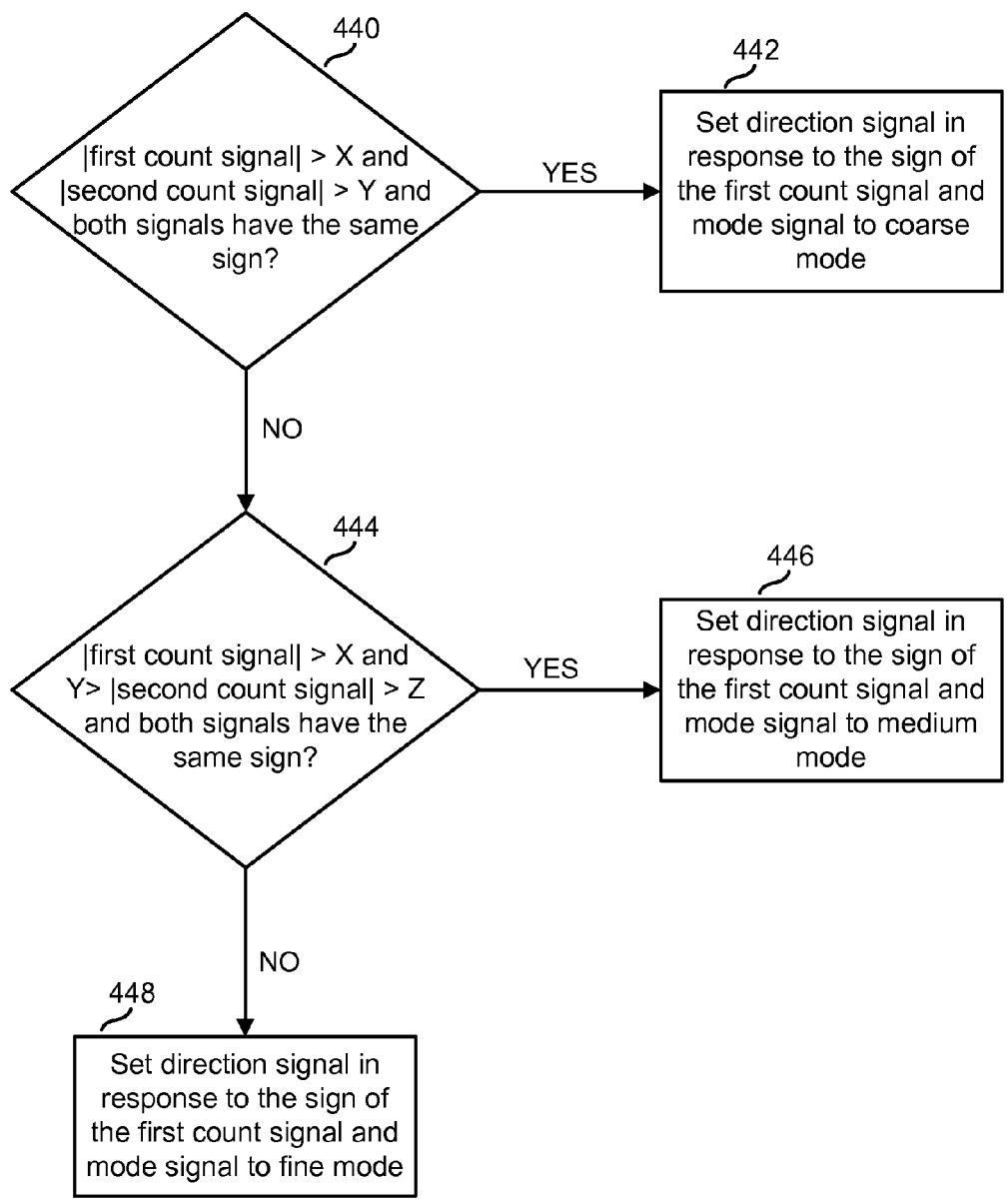
FIG. 4C shows a flow diagram illustrating one example of detailed steps of another one of the process blocks of the process shown in FIG. 4A in accordance with the teachings of the present invention.

FIG. 4C shows a flow diagram illustrating one example of detailed steps that may occur in process block 413 in accordance with the teachings of the present invention. For instance, various different conditions on the first and the second count signals, and the corresponding values of the direction signal and the mode signal are shown in detail. Referring now to FIG. 4C, at block 440, it may be determined whether or not the magnitude of the first count signal is greater than the value X, whether or not the magnitude of the second count signal is greater than the value Y, and whether or not both signals have the same sign. If these conditions are met, process 413 proceeds to block 442. If not, process 413 proceeds to block 444.

At block 442, the direction signal is set in response to the sign of the first signal and the mode signal is set to a value that indicates the coarse mode as the operation mode of state selector circuit 154. For example, decision circuit 240 may set mode signal $U_{MD}$ 242 to zero and direction signal $U_{DIR}$ 244 to zero if the first signal is positive, and to one if the first signal is negative.

At block 444, it may be determined whether or not the magnitude of the first signal is greater than the value X, whether or not the magnitude of the second signal is less than the value Y but greater than the value Z, and whether or not both signals have the same sign. If these conditions are met, process 413 proceeds to block 446 where the direction signal is set in response to the sign of the first signal and the mode signal is set to a value that indicates the medium mode as the operation mode of state selector circuit 154. If the conditions at block 444 are not met, process 413 proceeds to block 448 where the direction signal is set in response to the sign of the first signal and the mode signal is set to a value that indicates the fine mode as the operation mode of state selector circuit 154.

Referring now back to FIG. 4A, at block 415, the operating condition of a power switch (e.g., power switch S1 170) of a switched-mode power supply may be adjusted in response to the direction signal, to the mode signal, and to at least one of the final values of the first count signal and the second count signal at the end of a feedback period. For example, state selector circuit 154 may change state signal $U_{ST}$ 160 based on the values of direction signal $U_{DIR}$ 244 and mode signal $U_{MD}$ 242. This may change a drive signal (e.g., drive signal $U_{DR}$ 162) coupled to drive switching of the power switch, thereby causing an operating condition of power switch S1 170 such as switching frequency and/or on-time to change. As previously mentioned, state selector circuit 154 may change state signal $U_{ST}$ 160 by an amount that varies based on the operation mode of state selector circuit 154. Therefore, state selector circuit 154 may vary the rate of change in the operating condition of power switch S1 170 over multiple feedback periods. In addition, state selector circuit 154 may keep state signal $U_{ST}$ 160 unchanged based on direction signal $U_{DIR}$ 244 and at least one of the final value of the first count signal and the final value of the second count signal. For example, when state selector circuit 154 is operating in the fine mode, if direction signal $U_{DIR}$ 244 changes and/or at least one of the final value of the first count signal and the final value of the second count signal drops below the minimum threshold count during a certain number of consecutive feedback periods, state selector circuit 154 may keep state signal $U_{ST}$ 160 unchanged. In some cases, when state signal $U_{ST}$ 160 increases, switching frequency of power switch S1 170 may increase resulting in more power to be delivered to load 122 and conversely, when state signal $U_{ST}$ 160 decreases, switching frequency of power switch S1 170 may decrease resulting in less power to be delivered to load 122.

Figure 5:
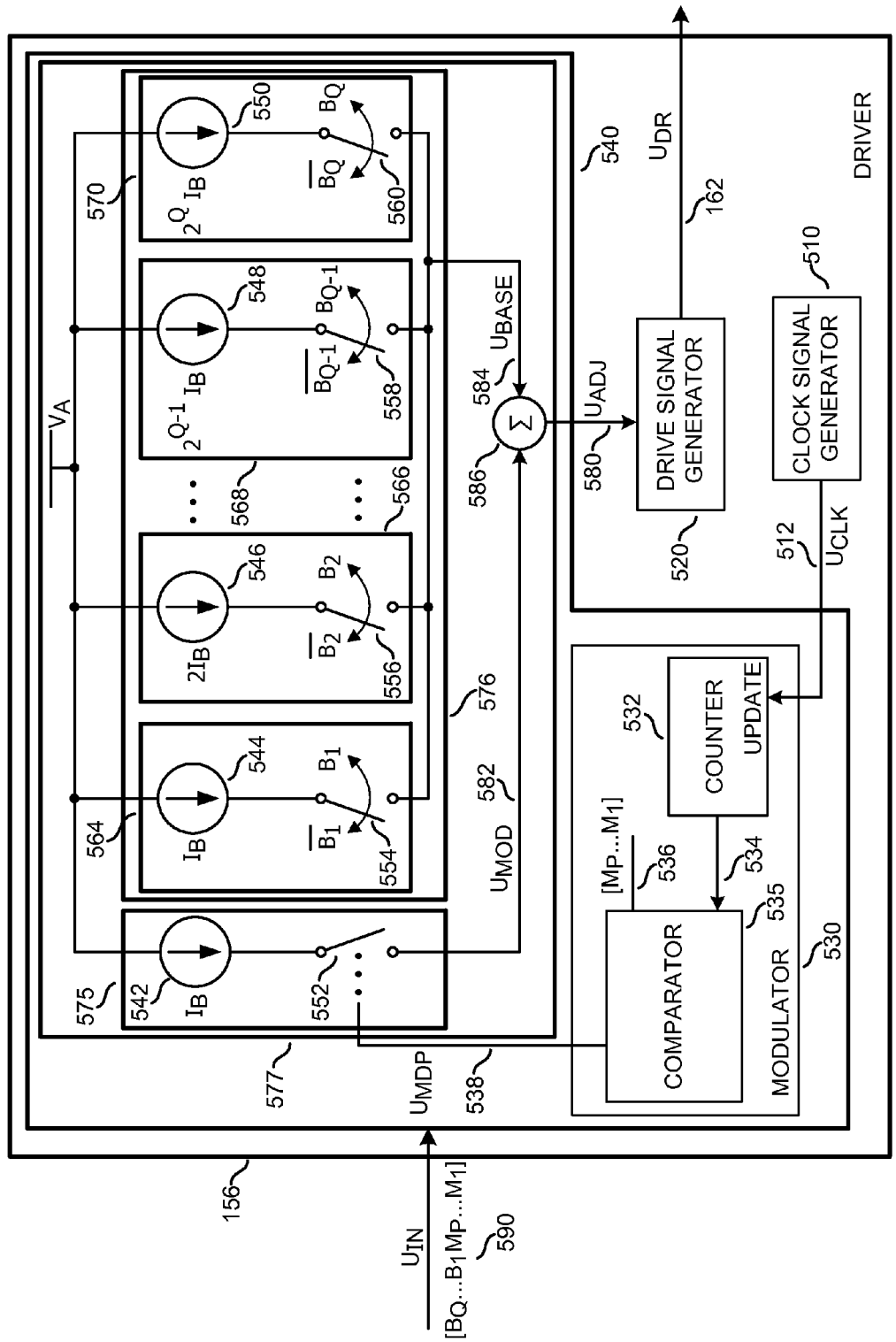
FIG. 5 shows a circuit diagram illustrating an example driver circuit including one example of a modulated DAC in accordance with the teachings of the present invention.

FIG. 5 is a schematic circuit diagram illustrating an example driver circuit including one example of a modulated DAC according to the teachings of the present invention. As shown, driver circuit 156 can be coupled to receive a digital input signal $U_{IN}$ 590 comprising (Q+P) bits, where Q and P are non-zero integers. Driver circuit 156 can be coupled to output drive signal $U_{DR}$ 162 in response to digital input signal $U_{IN}$ 590 to control the switching of power switch S1 170. In one example, digital input signal $U_{IN}$ 590 may correspond to state signal $U_{ST}$ 160 of the controller in FIG. 1A. In this disclosure, upper Q bits of digital input signal $U_{IN}$ 590 (i.e., bits $B_1$ through $B_Q$) are referred to as "baseline bits" with bit $B_Q$ being the most significant bit and bit $B_1$ being the least significant bit. Lower P bits of digital input signal $U_{IN}$ 590 (i.e., bits $M_1$ through $M_P$) are referred to as "modulation bits" with bit $M_P$ being the most significant bit and bit $M_1$ being the least significant bit.

Further illustrated in the example driver circuit is a modulated DAC 540 coupled to receive digital input signal $U_{IN}$ 590 and a clock signal $U_{CLK}$ 512. In the illustrated example, clock signal $U_{CLK}$ 512 is generated by a clock signal generator 510 that is included in driver circuit 156. In one example, clock signal $U_{CLK}$ 512 is a periodic signal with a fixed period. In response to digital input signal $U_{IN}$ 590 and clock signal $U_{CLK}$ 512, modulated DAC 540 outputs an adjust signal $U_{ADJ}$ 580 to a drive signal generator 520. Modulated DAC 540 can include a modulator 530 coupled to receive clock signal $U_{CLK}$ 512 and the modulation bits. In response, modulator 530 generates a modulation period signal UMP 538. In one example, modulation period signal UMP 538 is a periodic signal that alternates between logic high and logic low. The period of modulation period signal $U_{MDP}$ 538 may be proportional to the number of possible values (i.e., $2^P$) that can be represented by the modulation bits.

In the depicted example, modulator 530 includes a counter 532 and a comparator 535. Counter 532 has an UPDATE input coupled to receive clock signal $U_{CLK}$ 512. Comparator 535 is coupled to receive an output 534 of counter 532 and the modulation signal and in turn, output modulation period signal $U_{MDP}$ 538. In one example, counter 532 is configured to continually count up every period of clock signal $U_{CLK}$ 512. Specifically, counter 532 increments output 534 by counting up every period of clock signal $U_{CLK}$ 512 until output 534 reaches the maximum value of the modulation bits (i.e., $2^P-1$). In response to reaching the maximum value of the modulation bits, counter 532 sets output 534 back to zero and again counts up every period of clock signal $U_{CLK}$ 512. In one example, the period of modulation period signal $U_{MDP}$ 538 may be equal to $2^P$ periods of clock signal $U_{CLK}$ 512. In operation, comparator 535 can set modulation period signal $U_{MDP}$ 538 to logic high or logic low in response to comparing output 534 with the value of the modulation bits. In one example, comparator 535 can set modulation period signal $U_{MDP}$ 538 to logic high if output 534 is less than the value of the modulation bits and may set modulation period signal $U_{MDP}$ 538 to logic low if output 534 is greater than or equal to the value of the modulation bits. In other words, modulator 530 can adjust a portion of the period of modulation period signal $U_{MDP}$ 538 that modulation period signal $U_{MDP}$ 538 is logic high and a portion of the period that modulation period signal $U_{MDP}$ 538 is logic low in response to the value of the modulation bits. That is, modulator 530 can adjust the duty cycle of the modulation period signal $U_{MDP}$ 538 (i.e., the ratio of a portion of the period of modulation period signal $U_{MDP}$ 538 during which modulation period signal $U_{MDP}$ 538 is either logic high or logic low to the period of modulation period signal $U_{MDP}$ 538) in response to the value of the modulation bits. The duty cycle of modulation period signal $U_{MDP}$ 538 times the period of modulation period signal $U_{MDP}$ 538 may be referred to as a modulation time. As such, in one example, the modulation time represents the portion of the period of modulation period signal $U_{MDP}$ 538 during which modulation period signal $U_{MDP}$ 538 is logic high.

In one example, the value of the modulation bits determines the duty cycle of modulation period signal $U_{MDP}$ 538. For example, if there are three modulation bits and the value of the modulation bits is equal to three (i.e., 011 binary), the period of modulation period signal $U_{MDP}$ 538 is eight ($2^3$) periods of clock signal $U_{CLK}$ 512 and the duty cycle of the modulation period signal $U_{MDP}$ 538 is ⅜. Accordingly, modulation period signal $U_{MDP}$ 538 may be set to logic high for three periods of clock signal $U_{CLK}$ 512 and to logic low for five periods of clock signal $U_{CLK}$ 512 during every period of modulation period signal $U_{MDP}$ 538.

As further illustrated, modulated DAC 540 may include a DAC 577 comprising a group of switchable bit-to-analog circuitries 576 and a switchable modulation source 575. The number of switchable bit-to-analog circuitries included in DAC 577 may be equal to the number of baseline bits (i.e., Q). Group of switchable bit-to-analog circuitries 576 and switchable modulation source 575 may be coupled between a voltage source VA and a summing block 586. In the depicted example, group of switchable bit-to-analog circuitries 576 is coupled to receive the baseline bits and provide to summing block 586 a base signal $U_{BASE}$ 584, which is responsive to the baseline bits. In one example, each one of switchable bit-to-analog circuitries 564 to 570 includes a current source and a switch. Each one of switchable bit-to-analog circuitries 564 to 570 of the group can be switched in response to one of the baseline bits. Therefore, base signal $U_{BASE}$ 584 may be representative of the total sum of currents that is provided to summing block 586 from the group. It should be noted that, in other examples, each one of switchable bit-to-analog circuitries 564 to 570 may include other known circuit components such as a resistor, a capacitor in place of a current source. In one example, summing block 586 is a circuit node that is coupled to receive multiple currents and output a signal representative of the sum of these currents.

Furthermore, in the example modulated DAC 540, DAC 577 is a binary weighted DAC. That is, each one of current sources 544 to 550 of the group of switchable bit-to-analog circuitries outputs a current that has a magnitude that is weighted by power of two relative to the current output by the current source of the switchable bit-to-analog circuitry that is responsive to the adjacent less-significant bit of the baseline bits. In other words, switchable bit-to-analog circuitry 564 is responsive to the least significant bit $B_1$ and current source 544 outputs a current with the lowest magnitude $I_B$. Switchable bit-to-analog circuitry 566 is responsive to bit B2 and current source 546 outputs a current that is twice as large as $I_B$. The magnitude of the current output by each one of the current sources of the remaining switchable bit-to-analog circuitries successively doubles such that current source 550 of switchable bit-to-analog circuitry 570 responsive to the most significant bit $B_Q$ outputs a current that has magnitude $2^Q I_B$.

As further shown, switches 554 to 560 coupled to current sources 544 to 550, respectively, can be switched in response to one of the baseline bits. Specifically, each one of switches 554 to 560 can be switched in response to the bit of the baseline bits to which the corresponding switchable bit-to-analog circuitry is responsive. For example, switchable bit-to-analog circuitry 564 includes switch 554 that is coupled to current source 544. Since switchable bit-to-analog circuitry 564 is responsive to the least significant bit $B_1$ of the baseline bits, switch 554 can be switched in response to the least significant bit $B_1$. In the depicted example, a high value for one of the digits of the baseline bits may close (i.e., enable) the respective switch to couple the corresponding current source to summing block 586. Conversely, a low value for one of the digits of the baseline bits may open (i.e., disable) the respective switch to prevent current from its respective current source from entering summing block 586. Therefore, base signal $U_{BASE}$ 584 that enters summing block 586 is an analog signal representative of the value of the baseline bits. In the example of FIG. 5, a low value for one of the baseline bits is a high value for the complement of that one of the baseline bits. As illustrated, a bar over the symbol for a bit of the baseline bits represents the complement of the bit.

It should be noted that other examples of modulated DAC 540 may have multiple switches within each one of switchable bit-to-analog circuitries to direct current from current sources 544 to 550 to other nodes for other reasons, such as for calibration.

In the example DAC 577, switchable modulation source 575 is coupled to output a modulated signal $U_{MOD}$ 582 in response to modulation period signal $U_{MDP}$ 538. Switchable modulation source 575 includes a current source 542 that outputs a current that has magnitude equal to that of the current source of the switchable bit-to-analog circuitry responsive to the least significant bit $B_1$ of the baseline bits. In other words, current source 542 outputs a current that has a magnitude of $I_B$. Switchable modulation source 575 also includes a switch 552 coupled to current source 542. Switch 552 can be switched in response to modulation period signal UMP 538. In one example, when modulation period signal $U_{MDP}$ 538 is logic high, switch 552 closes (i.e., is enabled) to couple current source 542 to summing block 586 and when modulation period signal $U_{MDP}$ 538 is logic low, switch 552 opens (i.e., is disabled) to prevent current from current source 542 from entering summing block 586. That is, in operation, switchable modulation source 575 may alternate modulated signal $U_{MOD}$ 582 between $I_B$ and zero in response to modulation period signal $U_{MDP}$ 538. In such cases, modulated signal $U_{MOD}$ 582 is also a periodic signal with the same period as that of modulation period signal $U_{MDP}$ 538 (i.e., $2^P$ periods of clock signal $U_{CLK}$ 512).

As depicted in the example in FIG. 5, adjust signal $U_{ADJ}$ 580 output by modulated DAC 540 is the sum of currents that are received by summing block 586, namely the sum of modulated signal $U_{MOD}$ 582 and base signal $U_{BASE}$ 584. In one example, this means that adjust signal $U_{ADJ}$ 580 is a periodic signal with the same period as that of modulation period signal $U_{MDP}$ 538 and modulated signal $U_{MOD}$ 582 (i.e., $2^P$ periods of clock signal $U_{CLK}$ 512). In operation, by alternating modulated signal $U_{MOD}$ 582 between $I_B$ and zero in response to modulation period signal $U_{MDP}$ 538, switchable modulation source 575 can cause adjust signal $U_{ADJ}$ 580 to alternate between base signal $U_{BASE}$ 584 and base signal $U_{BASE}$ 584 plus $I_B$ during a period of adjust signal $U_{ADJ}$ 580. Because the current source of the switchable bit-to-analog circuitry that is responsive to the least significant bit of the baseline bits outputs a current that has a magnitude of $I_B$, the difference in base signal $U_{BASE}$ 584 for two adjacent values of the baseline bits is equal to $I_B$. Therefore, base signal $U_{BASE}$ 584 and base signal $U_{BASE}$ 584 plus $I_B$ may represent two adjacent discrete levels of adjust signal $U_{ADJ}$ 580 with base signal $U_{BASE}$ 564 corresponding to the lower level, which may also be referred to as the "base level." In this case, adjust signal $U_{ADJ}$ 580 is an analog signal having discrete levels that are set in response to the value of the baseline bits and the value of the modulation bits.

As previously mentioned, modulated DAC 540 may alternate adjust signal $U_{ADJ}$ 580 between two adjacent discrete levels in response to modulation period signal $U_{MDP}$ 538. Specifically, modulated DAC 540 may set a portion of the period of adjust signal $U_{ADJ}$ 580 that adjust signal $U_{ADJ}$ 580 is the greater of the adjacent levels in response to modulation period signal $U_{MDP}$ 538. For example, modulated DAC 540 may set adjust signal $U_{ADJ}$ 580 to the greater level when modulation period signal $U_{MDP}$ 538 is logic high and set adjust signal $U_{ADJ}$ 580 to the base level when modulation period signal $U_{MDP}$ 538 is logic low. Modulated DAC 540 may thus set the portion of the period of adjust signal $U_{ADJ}$ 580 during which adjust signal $U_{ADJ}$ 580 is the greater level to be equal to the modulation time.

In the depicted example, the average value of adjust signal $U_{ADJ}$ 580 may over time become equal to one of several additional levels that are equally spaced between the adjacent levels of adjust signal $U_{ADJ}$ 580. More particularly, by changing the modulation time between zero and $(2^P-1)$ periods of clock signal $U_{CLK}$ 512 in response to the value of the modulation bits, modulated DAC 540 may output an adjust signal $U_{ADJ}$ 580 with an average value equal to one of $(2^P-1)$ equally spaced levels between any pair of adjacent levels. In this manner, modulated DAC 540 may generate a signal at its output with the equivalent number of discrete levels and hence with the same resolution that a conventional (P+Q) bit DAC can generate.

Modulated DAC 540 can thus reduce the area required for implementing a DAC since modulated DAC 540 may need only Q circuit components (e.g., current sources) to achieve the same resolution as that of a (P+Q) bit DAC. Although the example modulated DAC of FIG. 5 provides higher resolution by alternating the output between adjacent levels, in other examples, an averaging circuit such as a low pass filter, an integrator or the like can be used either in the modulated DAC or outside of the modulated DAC to generate the average value of adjust signal $U_{ADJ}$ 580.

In the illustrated modulated DAC 540, modulator 530 operates in conjunction with a binary weighted DAC to alternate the output between adjacent levels. In other cases, modulator 530 can operate in conjunction with other types of DACs (e.g., thermometer coded DAC, R–2R ladder DAC) that are appropriately modified. For example, modulated DAC 540 may include a DAC that generates two levels for the output in response to the baseline bits. One of the levels may correspond to the value of the baseline bits and the other one of the levels may correspond to one of the adjacent values of the baseline bits. In this example, the DAC may alternate the output between the two levels in response to modulation period signal $U_{MDP}$ 538.

In some implementations, rather than generating a modulation signal that alternates between a logic high level and a logic low level, one or more signals that alternate between adjacent digital levels can be received by a DAC. For example, a multiplexer can output a digital signal that is set to a first level for a first period of time and to an adjacent second level for a second period of time within a period. The DAC can receive the digital signal at the output of the multiplexer and convert the alternating digital signal to an analog output as adjust signal $U_{ADJ}$ 580. The first level may be determined, for example, based on the value of the baseline bits or the value of the digital input signal received by a modulated DAC. The first period of time and the second period of time can be determined, for example, based on the value of the modulation bits or in response to a separate signal that sets the duty cycle of modulation period signal $U_{MDP}$ 538. In this case, the multiplexer would be acting as a modulator and its output would alternate between a higher digital level and a lower digital level. In yet another implementation, rather than converting the digital signal at the output of the multiplexer to an analog output, the digital signal may be output as adjust signal $U_{ADJ}$ 580.

In the example driver circuit 156, drive signal generator 520 is coupled to receive adjust signal $U_{ADJ}$ 580 and in response, output drive signal $U_{DR}$ 162. Drive signal $U_{DR}$ 162 may be a periodic signal that alternates between logic high and logic low. In operation, drive signal generator 520 can set certain properties of drive signal $U_{DR}$ 162 based on adjust signal $U_{ADJ}$ 580. Examples of such properties of drive signal $U_{DR}$ 162 include period, ratio of logic high to logic low in a period, etc. By setting the properties of drive signal $U_{DR}$ 162, drive signal generator 520 can set the operating condition of power switch S1 170. In one example, drive signal generator 520 may include switches, capacitors, and comparators (not shown in FIG. 5). Drive signal generator 520 can use the charging and discharging of those capacitors in response to adjust signal $U_{ADJ}$ 580 to set one or more properties of drive signal $U_{DR}$ 162. In another example, drive signal generator 520 can include a circuit (e.g., a digital pulse width modulation circuit) to output a rectangular signal as drive signal $U_{DR}$ 162. The circuit can be coupled to receive an alternating digital signal (e.g., the digital signal at the output of the multiplexer) and configured to set one or more properties of drive signal $U_{DR}$ 162 in response to the alternating digital signal.

Figure 6:
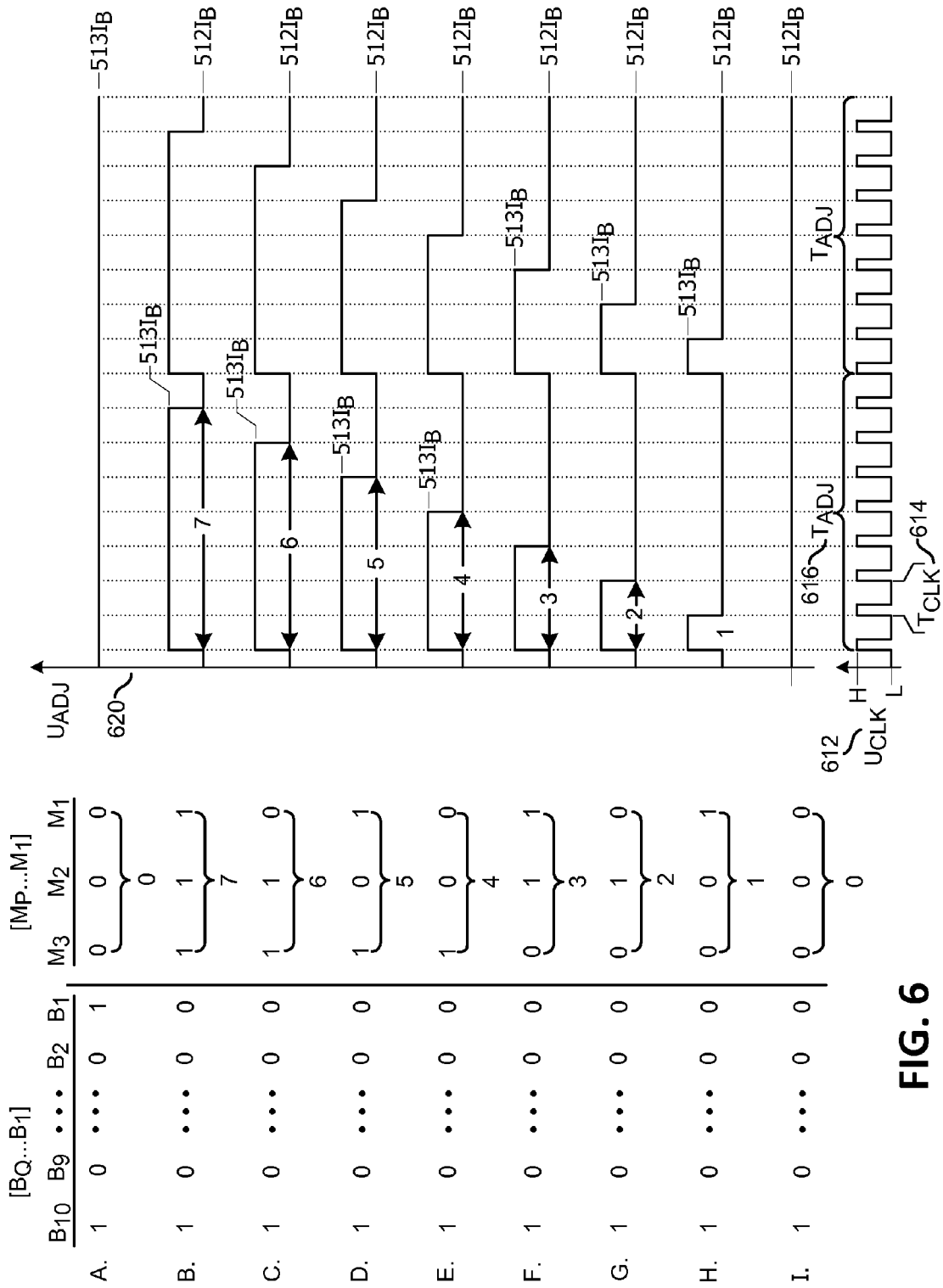
FIG. 6 shows a table illustrating different values of an example digital signal received as an input by the driver circuit in FIG. 5 and a timing diagram illustrating waveforms for various signals that are associated with the example modulated DAC in accordance with the teachings of the present invention.

FIG. 6 shows a table illustrating different values of an example digital signal received as an input signal by driver circuit 156 and a timing diagram illustrating waveforms of various signals of modulated DAC 540. In the illustrated example, the table includes nine rows from row A to row I where each row shows a different value of the input signal that, in one example, may be representative of input signal $U_{IN}$ 590. Specifically, the input signal includes a total of 13 bits with upper ten bits set aside as the baseline bits (i.e., Q equals ten) and lower three bits set aside as the modulation bits (i.e., P equals three). As shown, in each row of the table, the portion of the input signal corresponding to the baseline bits is separated from the portion corresponding to the modulation bits by a solid line. Further illustrated in FIG. 6 is periodic waveform 612 with a period $T_{CLK}$ 614 and that alternates between logic high H and logic low L. In one example, waveform 612 is representative of clock signal $U_{CLK}$ 512 generated by clock signal generator 510. FIG. 6 also includes a collection of example waveforms 620 for adjust signal $U_{ADJ}$ 580. Each waveform of the collection corresponds to the input signal in the respective adjacent row of the table.

In the depicted example, since there are three bits used as modulation bits, the value of the modulation bits can be one of eight different values between zero and seven. Waveforms in collection 620 are periodic with a period $T_{ADJ}$ 616 which is equal to eight periods of waveform 612 (i.e., eight times period $T_{CLK}$ 614). As previously mentioned, the base level of adjust signal $U_{ADJ}$ 580 is set in response to the value of baseline bits and the duty cycle of modulation period signal $U_{MDP}$ 538 is set in response to the value of the modulation bits. In the example, the input signal in row A indicates 513 for the value of the baseline bits and zero for the value of the modulation bits. In response to receiving this input signal, modulated DAC 540 sets the base level of adjust signal $U_{ADJ}$ 580 to $513I_B$ and the duty cycle of modulation period signal $U_{MDP}$ 538 to zero. In other words, modulated DAC 540 sets modulation period signal $U_{MDP}$ 538 to logic low for the entire period of modulation period signal $U_{MDP}$ 538. Accordingly, the corresponding waveform of group 620 is constant and equal to the base level of $513I_B$. For rows B through I, the value of the baseline bits indicated by the respective input signal is the same and equal to 512 but the value of the modulation bits decreases from seven in row B to zero in row I. Thus, for rows B through I, the base level of adjust signal $U_{ADJ}$ 580 is equal to $512I_B$, the greater of the adjacent levels of adjust signal $U_{ADJ}$ 580 is equal to $513I_B$ ($512I_B+I_B$) and the modulation time is equal to the value of the modulation bits times period Tux 614. In other words, modulation period signal $U_{MDP}$ 538 is logic high for a length of time that is equal to the value of the modulation bits times period Tux 614. As a result, for rows B through I, each corresponding waveform of group 620 is set to the $513I_B$ for the corresponding modulation time during each period $T_{ADJ}$ 616. For example, in row B, the value of the modulation bits is seven, the corresponding modulation time is seven times period $T_{CLK}$ 614 and the corresponding waveform of group 620 is set to $513I_B$ for seven times period $T_{CLK}$ 614 during each period $T_{ADJ}$ 616. Similarly, in row E, the value of the modulation bits is four, the corresponding modulation time is four times period $T_{CLK}$ 614 and the corresponding waveform is set to $513I_B$ for four times period $T_{CLK}$ 614 during each period $T_{ADJ}$ 616.

Figure 7:
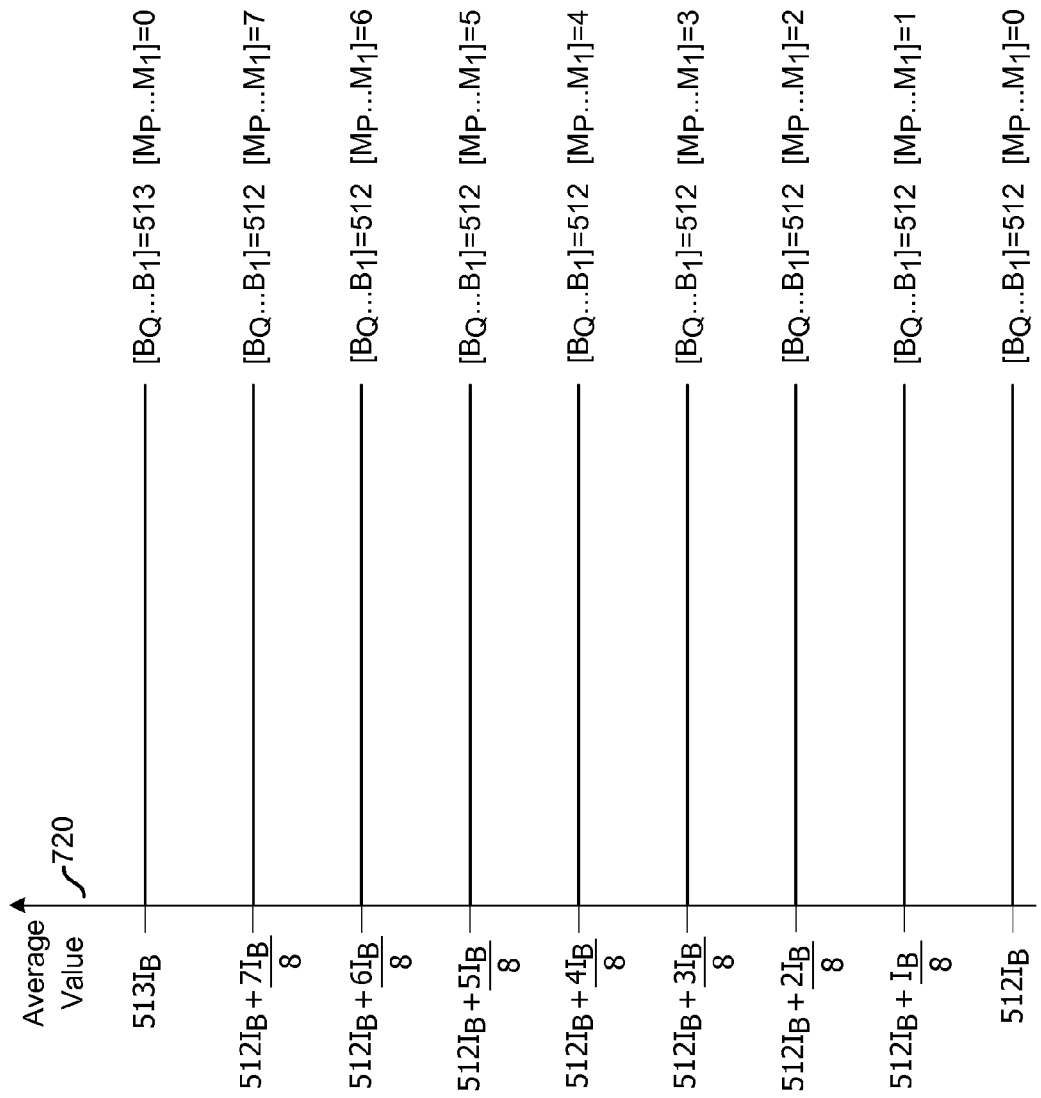
FIG. 7 shows a collection of signal levels illustrating example average values for the output of the modulated DAC of FIG. 5 in accordance with the teachings of the present invention.

FIG. 7 shows a collection of signal levels illustrating example average values for the output of the modulated DAC of FIG. 5. Specifically, each one of levels of collection 720 in FIG. 7 represents the average value of the corresponding waveform of collection 620 that is responsive to the input signal in the respective adjacent row of the table in FIG. 6. In other words, FIG. 7 is an expanded view illustrating both the adjacent levels of $512I_B$ and $513I_B$ of adjust signal $U_{ADJ}$ 580 and the additional seven ($2^3-1$) equally spaced levels between these adjacent levels. As shown, the levels of collection 720 that correspond to the input signals in row A and I of the table in FIG. 6 are equal to $513I_B$ and $512I_B$, respectively. As the modulation time decreases from seven times period $T_{CLK}$ 614 in row B to one times period $T_{CLK}$ 614 in row H, the corresponding level of collection 720 (i.e., the average value of adjust signal $U_{ADJ}$ 580) decreases by steps of (⅛)$I_B$. For example, the average value of the waveform of collection 620 corresponding to row B is ($512I_B+(⅞)I_B$), the average value of the waveform of collection 620 corresponding to row C is ($512I_B+(6/8)I_B$) and so on. It should be noted that even though the example waveforms and levels in FIG. 6 and FIG. 7 only illustrate this behavior for one pair of adjacent levels of adjust signal $U_{ADJ}$ 580 (i.e., $512I_B$ and $513I_B$), the same behavior can be seen for any pair of adjacent levels. Therefore, an adjust signal $U_{ADJ}$ 580 generated by using ten current sources in this manner may have the equivalent number of discrete levels and the same resolution as that of a signal generated by a 13 bit DAC that uses, for example, 13 current sources.

Figure 8:
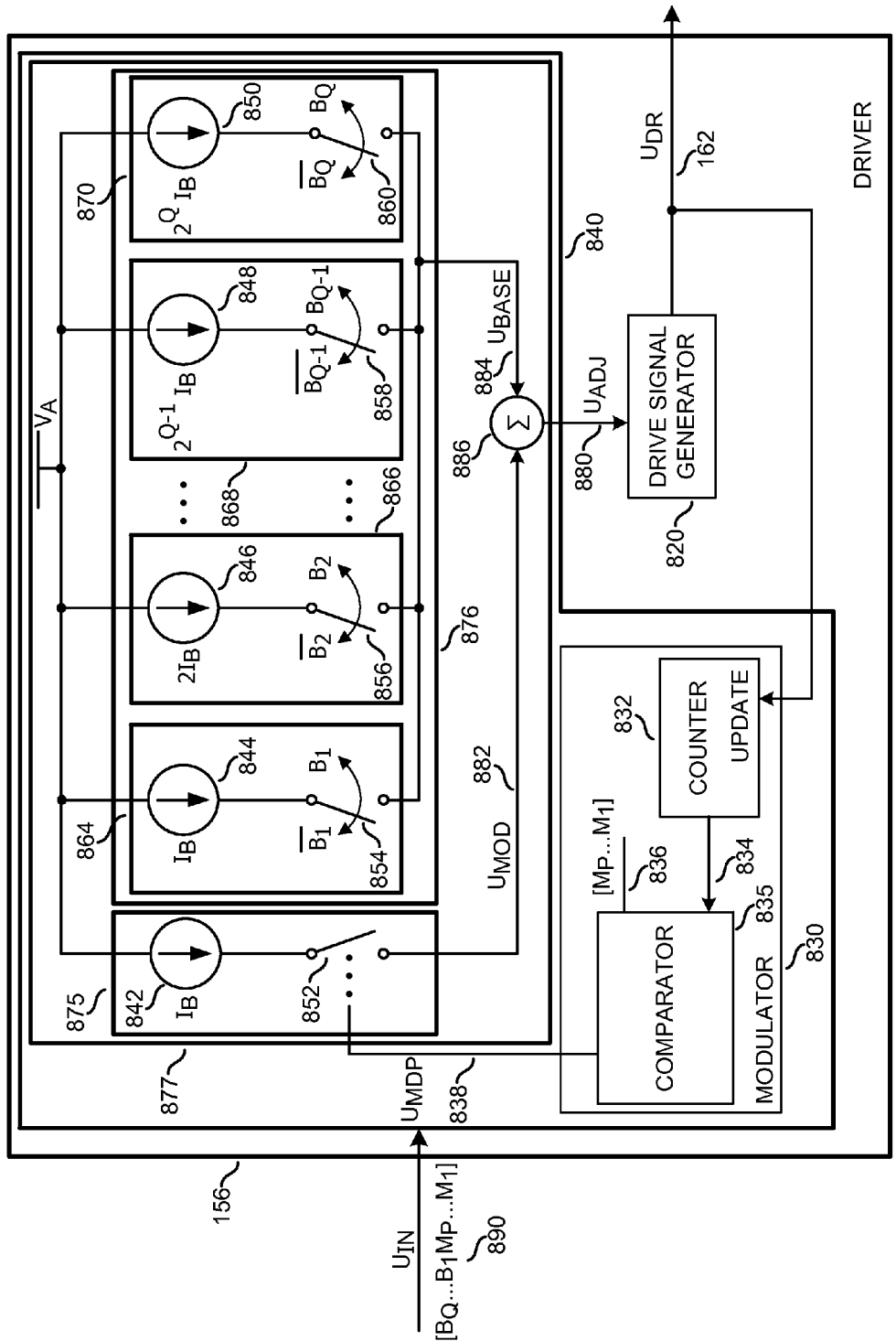
FIG. 8 shows a circuit diagram illustrating another example of a driver circuit in accordance with the teachings of the present invention.

FIG. 8 is a schematic circuit diagram illustrating another implementation of the driver circuit in FIG. 1A according to the teachings of the present invention. Driver circuit 156 in FIG. 8 differs from driver circuit 156 in FIG. 5 in that counter 832 is coupled to receive drive signal $U_{DR}$ 162 at its UPDATE input. Consequently, the periods of modulation period signal $U_{MDP}$ 838, modulated signal $U_{MOD}$ 882 and adjust signal $U_{ADJ}$ 880 are all equal to $2^P$ times the period of drive signal $U_{DR}$ 162. In the example driver circuit, since the period of drive signal $U_{DR}$ 162 may vary in response to adjust signal $U_{ADJ}$ 880, the periods of modulation period signal $U_{MDP}$ 838, modulated signal $U_{MOD}$ 882 and adjust signal $U_{ADJ}$ 880 may also vary during the operation of controller 150.

Figure 9:
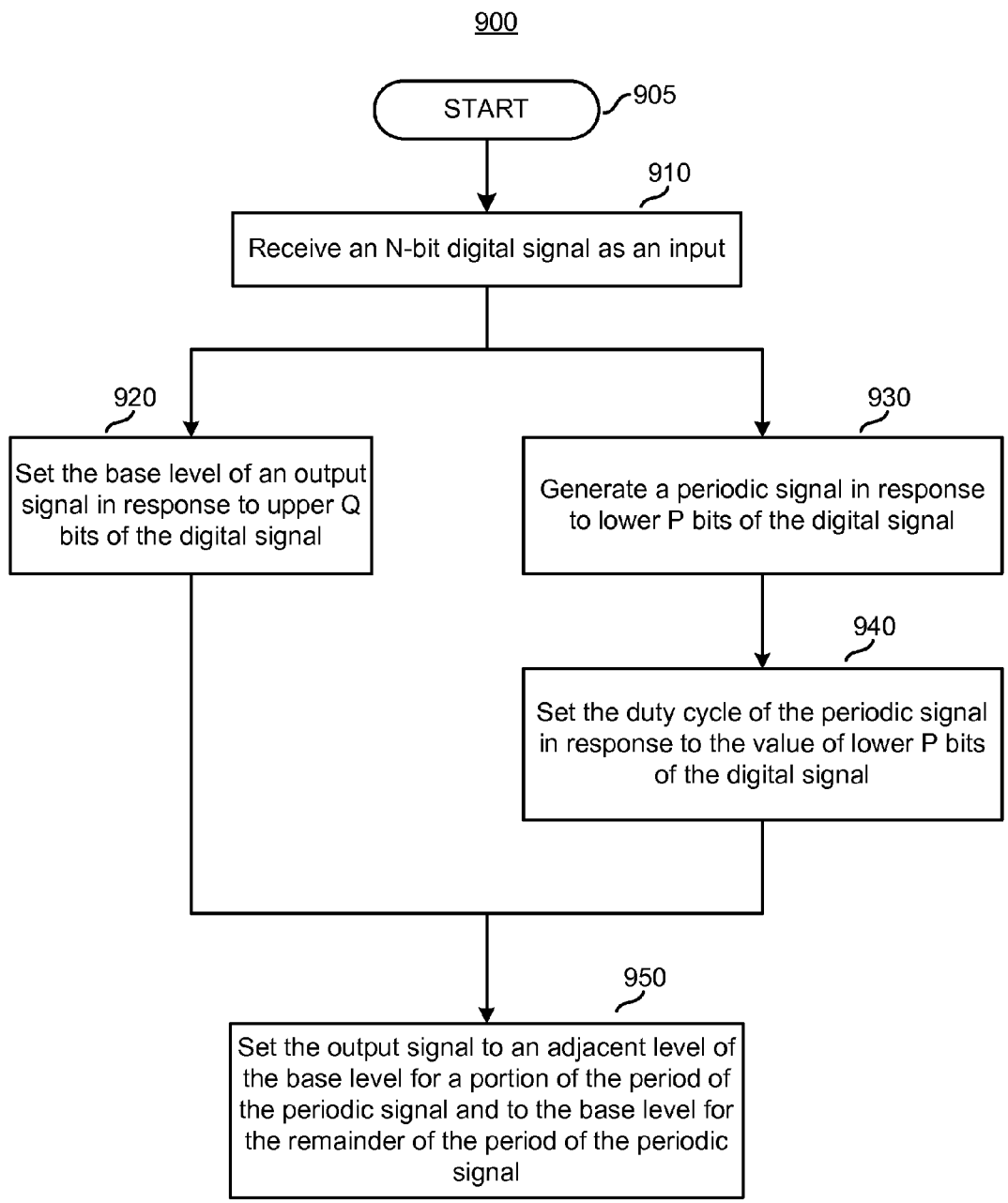
FIG. 9 shows a flow diagram illustrating an example process for generating an analog signal having discrete levels in response to a digital signal in one example of a power supply controller in accordance with the teachings of the present invention.

FIG. 9 is a flow diagram illustrating an example process 900 according to the teachings of the present invention for generating an analog signal having discrete levels in response to a digital signal. In the depicted example, process 900 may begin at block 905. At block 910, an N bit digital signal is received as an input. At block 920, the base level of an output signal is set in response to upper Q bits of the input. More particularly, the base level may be proportional to the value of a digital signal represented by upper Q bits of the input. For example, Q may be chosen as ten and the digital signal represented by upper Q bits of the input may be equal to 512. In this case, the base level of the output signal may be equal to 512 times a current that has a magnitude of $I_B$.

At block 930, a periodic signal is generated in response to lower P bits of the input. In one example, the periodic signal has a period proportional to the number of possible values that can be represented by lower P bits of the input (i.e., $2^P$). For example, when P is chosen as three, the period of the periodic signal may be eight ($2^3$) periods of a clock signal. The periodic signal may alternate between logic low and logic high during that period. At block 940, the duty cycle of the periodic signal (i.e., the ratio of either a logic high or logic low portion of the period of the periodic signal to the period of the periodic signal) is set in response to the value of lower P bits of the input. The duty cycle of the periodic signal times the period of the periodic signal may represent a modulation time. Thus, in one example, the portion of the period during which the periodic signal is set to logic high may be equal to the modulation time and hence, proportional to the value of lower P bits of the input. For example, the value of lower P bits of the input may be equal to five. In this case, the duty cycle of the periodic signal may be ⅝, the modulation time may be five periods of the clock signal and the periodic signal may be logic high for five of eight periods of the clock signal.

At block 950, the output signal may be set to an adjacent level of the base level for the modulation time and to the base level for the remainder of the period of the periodic signal. In one example, the adjacent level corresponds to the greater of the two closest levels of the base level that can be generated in response to upper Q bits of the input. For example, the base level of the output signal may increase or decrease in steps of value $I_B$ in response to upper Q bits of the input. In this case, when the base level is equal to $512I_B$, the adjacent level becomes equal to $513I_B$. Consequently, the output signal may be set to $513I_B$ for the modulation time and to $512I_B$ for the remainder of the period of the periodic signal.

In this manner, the average value of the output signal generated by process 900 may be equal to one of ($2^P$–1) additional levels that are equally spaced between any pair of adjacent levels of the output signal. As such, the output signal generated by using Q current sources according to process 900 can achieve the same resolution as that of a signal generated by a (Q+P) bit DAC that uses (Q+P) current sources.

In one example, the illustrated process may be performed by a modulated DAC 540 or 840. Modulated DAC 540 or 840 may perform process block 910 by receiving input signal $U_{IN}$ 590 or 890 as an N bit digital signal. When group of switchable bit-to-analog circuitries 576 or 876 performs process block 920, the base level of an output signal (e.g., adjust signal $U_{ADJ}$ 580 or 880) is set in response to upper Q bits of the digital signal. In one example, group of switchable bit-to-analog circuitries 576 or 876 can set the base level of the output signal by outputting base signal $U_{BASE}$ 584 or 884 to summing block 566 or 866. Generating a periodic signal (e.g., modulation period signal $U_{MDP}$ 538 or 838) in response to P lower bits of the digital signal in process block 930 can be performed by modulator 530 or 830. Setting the duty cycle of the periodic signal (hence, the modulation time) in response to the value of lower P bits of the digital signal in process block 940 can also be performed by modulator 530 or 830. Setting the output signal to an adjacent level of the base level for the modulation time and to the base level for the remainder of the period of the periodic signal in process block 950 can be performed by switchable modulation source 575 or 875 and group of switchable bit-to-analog circuitries 576 or 876. In particular, switchable modulation source 575 or 875 can be configured to couple a current source (e.g., current source 542 or 842) to summing block 566 or 866 to provide an additional signal (e.g., modulated signal $U_{MOD}$ 582 or 882) in response to modulation period signal UMP 538 or 838 such that the output signal is set to the adjacent level of the base level for the modulation time. Conversely, switchable modulation source 575 or 875 can be configured to prevent the current source from coupling to summing block 566 or 866 in response to modulation period signal $U_{MDP}$ 538 or 838 such that the output signal is set to the base level for the remainder of the period of the periodic signal.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:
1. A digital-to-analog converter circuit, comprising:
   an input to receive a digital input signal having multiple bits;
   a modulation circuit coupled to respond to less significant bits of the digital input signal by outputting a modulation signal that alternates between a logic low level and a logic high level;
   a digital-to-analog circuit configured to convert more significant bits of the digital input signal to a first analog level, wherein the digital-to-analog circuit is configured to alternate an analog output between the first analog level corresponding to a value of the more significant bits and a second analog level corresponding to one of adjacent values of the more significant bits in response to the modulation signal.

2. The digital-to-analog converter circuit of claim 1, wherein the modulation signal is periodic with a period that is proportional to a number of possible values that can be represented by the less significant bits of the digital input signal.

3. The digital-to-analog converter circuit of claim 2, wherein a duty cycle of the modulation signal is proportional to a value of the less significant bits of the digital input signal.

4. The digital-to-analog converter circuit of claim 1, wherein the modulation circuit includes:
   a counter coupled to receive a clock signal and count in response to the clock signal, wherein the counter is configured to reset a counter output to an initial value when the counter counts a threshold number of times; and
   a comparator coupled to receive the less significant bits of the digital input signal and the counter output, wherein the comparator is configured to output the modulation signal in response to a comparison of the counter output and the value of the less significant bits of the digital input signal.

5. The digital-to-analog converter circuit of claim 4, wherein the threshold number is equal to a number of possible values that can be represented by the less significant bits of the digital input signal.

6. The digital-to-analog converter circuit of claim 4, wherein the period of the modulation signal is equal to the period of the clock signal multiplied by a number of possible values that can be represented by the less significant bits of the digital input signal.

7. The digital-to-analog converter circuit of claim 1, wherein the digital-to-analog circuit is a binary-weighted digital-to-analog converter.

8. The digital-to-analog converter circuit of claim 1, wherein the digital-to-analog circuit includes a plurality of bit-to-analog circuitries switchable in response to the more significant bits of the digital input signal, each of the plurality of bit-to-analog circuitries including a switch responsive to one of the more significant bits of the digital input signal and a current source.

9. The digital-to-analog converter circuit of claim 8 further including a modulation source switchable in response to the modulation signal, the modulation source being configured to output a current that alternates between zero and a level to which a least significant bit of the more significant bits of the digital input signal is converted.

10. The digital-to-analog converter circuit of claim 9 further including a summing block coupled to sum the analog output of the digital-to-analog circuit and the current output by the modulation source.

11. A control circuit for use in a power converter having a switch, the control circuit comprising:

a digital-to-analog converter circuit, coupled to receive a digital input signal having multiple bits, the digital-to-analog converter circuit including:
   a modulation circuit coupled to respond to less significant bits of the digital input signal by outputting a modulation signal that alternates between a logic low level and a logic high level;
   a digital-to-analog circuit configured to convert more significant bits of the digital input signal to a first analog level, wherein the digital-to-analog circuit is configured to alternate an analog output between the first analog level corresponding to a value of the more significant bits and a second analog level corresponding to one of adjacent values of the more significant bits in response to the modulation period signal; and
a drive signal generator coupled to receive the analog output and output a drive signal to drive the switching of the switch, wherein the drive signal generator is configured to adjust the drive signal to set at least one of an on-time and a switching frequency of the switch in response to the analog output.

12. The control circuit of claim 11, wherein the modulation signal is periodic with a period that is proportional to a number of possible values that can be represented by the less significant bits of the digital input signal.

13. The control circuit of claim 12, wherein a duty cycle of the modulation signal is proportional to the value of the less significant bits of the digital input signal.

14. The control circuit of claim 11, wherein the modulation circuit includes:
   a counter coupled to receive a clock signal and count in response to the clock signal, wherein the counter is configured to reset a counter output to an initial value when the counter counts a threshold number of times; and
   a comparator coupled to receive the counter output and the less significant bits of the digital input signal, wherein the comparator is configured to output the modulation signal in response to a comparison of the counter output and the value of the less significant bits of the digital input signal.

15. The control circuit of claim 11, wherein the digital-to-analog circuit includes a plurality of bit-to-analog circuitries switchable in response to the more significant bits of the digital input signal, wherein a level to which each of the more significant bits is converted is twice a level to which an adjacent lower bit of the more significant bits is converted.

16. The control circuit of claim 15, wherein each of the plurality of bit-to-analog circuitries includes a switch responsive to one of the more significant bits of the digital input signal and a current source.

17. The control circuit of claim 16, wherein each current source of the plurality of bit-to-analog circuitries is configured to output a current that is twice a current output by a current source of the bit-to-analog circuitry that is responsive to an adjacent lower bit of the more significant bits.

18. The control circuit of claim 15, wherein the digital-to-analog circuit further includes a modulation source switchable in response to the modulation signal, the modulation source being configured to output a current that alternates between zero and a level to which a least significant bit of the more significant bits of the digital input signal is converted.

19. The control circuit of claim 18, wherein the digital-to-analog converter circuit includes a summing block coupled to sum a current output by the modulation source and the first analog level.

20. A control circuit for a power supply having a power switch, the control circuit comprising:
   a modulation circuit coupled to receive a digital signal and a clock signal, and to output a modulation signal, wherein the modulation circuit is configured to set the modulation signal to a first level corresponding to a value of the more significant bits of the digital signal for a first number of periods of the clock signal and to a second level corresponding to an adjacent value of the more significant bits of the digital signal for a second number of periods of the clock signal, the first number and the second number being representative of a value of less significant bits of the digital signal; and
   a drive signal generator coupled to output a drive signal to drive switching of the power switch, wherein the drive signal generator is configured to adjust the drive signal to set at least one of an on-time and a switching frequency of the switch in accordance with a setting of the modulation signal.

21. The control circuit of claim 20 further including a digital-to-analog circuit coupled to convert the modulation signal to an analog output, the drive signal generator being configured to adjust the drive signal to set at least one of an on-time and a switching frequency of the power switch in response to the analog output.

* * * * *